United States Patent
Roni et al.

(10) Patent No.: US 11,774,777 B2
(45) Date of Patent: Oct. 3, 2023

(54) METHOD FOR MAKING AN EYEGLASS LENS COATED BY MEANS OF PHYSICAL VAPOR DEPOSITION PVD

(71) Applicant: THE'LIOS S.P.A., Longarone (IT)

(72) Inventors: Carlo Roni, Belluno (IT); Marco Queboli, Padua (IT); Claudia Fagini, Pordenone (IT); Danilo Mandelli, Merate (IT)

(73) Assignee: THE'LIOS S.P.A., Longarone (IT)

( * ) Notice: Subject to any disclaimer, the term of this patent is extended or adjusted under 35 U.S.C. 154(b) by 689 days.

(21) Appl. No.: 16/792,969

(22) Filed: Feb. 18, 2020

(65) Prior Publication Data
US 2020/0264448 A1 Aug. 20, 2020

(30) Foreign Application Priority Data
Feb. 18, 2019 (IT) .................. 102019000002339

(51) Int. Cl.
*C23C 14/04* (2006.01)
*G02C 7/02* (2006.01)
(Continued)

(52) U.S. Cl.
CPC .............. *G02C 7/024* (2013.01); *B29D 11/00* (2013.01); *B29D 11/00009* (2013.01);
(Continued)

(58) Field of Classification Search
CPC ... C23C 14/0015; C23C 14/042; C23C 14/50; C23C 14/542; C23C 14/044; C23C 14/24
See application file for complete search history.

(56) References Cited

U.S. PATENT DOCUMENTS 1,126,365 A * 1/1915 Bode .................... B23Q 16/001
                                                              269/303
2,851,925 A * 9/1958 Bernard .................. G02C 1/04
                                                              351/92
(Continued)

FOREIGN PATENT DOCUMENTS

BR   102017005746-1 A2 *  9/2017  ........... G02F 1/1333
CN       103144387 A   *  6/2013  ............. B32B 27/06
(Continued)

OTHER PUBLICATIONS

Rademacher, Daniel, et al., "New sputtering concept for optical precision coatings". Proc. SPIE 8168, Advances in Optical Thin Films IV, 81680O (Oct. 3, 2011) 1-7.*
(Continued)

*Primary Examiner* — Bret P Chen
(74) *Attorney, Agent, or Firm* — Mark M. Friedman

(57) ABSTRACT

Method for making an eyeglass lens coated by means of physical vapor deposition PVD, such method comprising a step of arranging a lens blank, provided with a first centering reference, a step of arranging a support body, provided with a first shaped and through opening oriented with respect to a second centering reference thereof, and a step of arranging a centering template. The present method then comprises an assembly step of the lens blank with the support body and of the support body with the centering template. Subsequently, the present method comprises a step of coating the lens blank by means of physical vapor deposition PVD, and finally comprises a cutting step in which the lens blank is cut along a cutting profile shaped in eyeglass lens form and oriented with respect to the first centering reference.

10 Claims, 10 Drawing Sheets

(51) Int. Cl.
*G02B 1/115* (2015.01)
*G02B 1/12* (2006.01)
*B29D 11/00* (2006.01)
*C23C 14/54* (2006.01)
*C23C 14/00* (2006.01)
*C23C 14/24* (2006.01)
*C23C 14/50* (2006.01)
*C03C 17/09* (2006.01)
*C03C 17/245* (2006.01)
*G02C 7/10* (2006.01)

(52) U.S. Cl.
CPC .... *B29D 11/0073* (2013.01); *B29D 11/00865* (2013.01); *C23C 14/0015* (2013.01); *C23C 14/042* (2013.01); *C23C 14/044* (2013.01); *C23C 14/24* (2013.01); *C23C 14/50* (2013.01); *C23C 14/542* (2013.01); *G02B 1/115* (2013.01); *G02B 1/12* (2013.01); *C03C 17/09* (2013.01); *C03C 17/245* (2013.01); *C03C 2218/15* (2013.01); *G02C 7/10* (2013.01)

(56) References Cited

U.S. PATENT DOCUMENTS

| | | | | |
|---|---|---|---|---|
| 3,501,842 | A * | 3/1970 | Beasley | B24B 13/0055 |
| | | | | 351/159.41 |
| 4,737,918 | A * | 4/1988 | Langlois | B24B 13/0055 |
| | | | | 700/192 |
| 4,885,875 | A * | 12/1989 | Soper | B24B 9/14 |
| | | | | 451/240 |
| 5,325,812 | A | 7/1994 | Thiebaud et al. | |
| 5,630,746 | A * | 5/1997 | Gottschald | B24B 9/148 |
| | | | | 451/5 |
| 5,632,668 | A * | 5/1997 | Lindholm | B24D 3/28 |
| | | | | 451/526 |
| 11,112,622 | B2 * | 9/2021 | Coppa | B29D 11/00413 |
| 2011/0229659 | A1 * | 9/2011 | Reynolds | G02B 1/10 |
| | | | | 427/595 |
| 2012/0186522 | A1 | 7/2012 | Adachi et al. | |
| 2012/0267045 | A1 * | 10/2012 | Honda | G02F 1/1341 |
| | | | | 156/285 |
| 2012/0287397 | A1 * | 11/2012 | Sone | G02C 7/083 |
| | | | | 359/676 |
| 2013/0037202 | A1 * | 2/2013 | Ando | G02F 1/1341 |
| | | | | 156/99 |
| 2014/0233105 | A1 * | 8/2014 | Schmeder | G01J 3/465 |
| | | | | 359/590 |
| 2016/0281210 | A1 * | 9/2016 | Boulineau | B29D 11/00865 |
| 2016/0318147 | A1 * | 11/2016 | Meschenmoser | C23C 14/24 |

FOREIGN PATENT DOCUMENTS

| | | | | |
|---|---|---|---|---|
| DE | 60300120 T2 * | 10/2005 | | B24B 13/005 |
| JP | 2005-1077 A * | 1/2005 | | B23Q 11/00 |
| JP | 2006267848 A | 10/2006 | | |
| JP | 2016132811 A | 7/2016 | | |

OTHER PUBLICATIONS

Vergohl, Michael, et al., "Industrial-scale deposition of highly uniform and precise optical interference filters by the use of an improved cylindrical magnetron sputtering system". Surface & Coatings Technology 267 (2015) 53-58.*

Iwahori, Koichiro, et al., "Optical properties of fluoride thin films deposited by RF magnetron sputtering". Applied Optics, vol. 45, No. 19, Jul. 1, 2006, 4598-4602.*

* cited by examiner

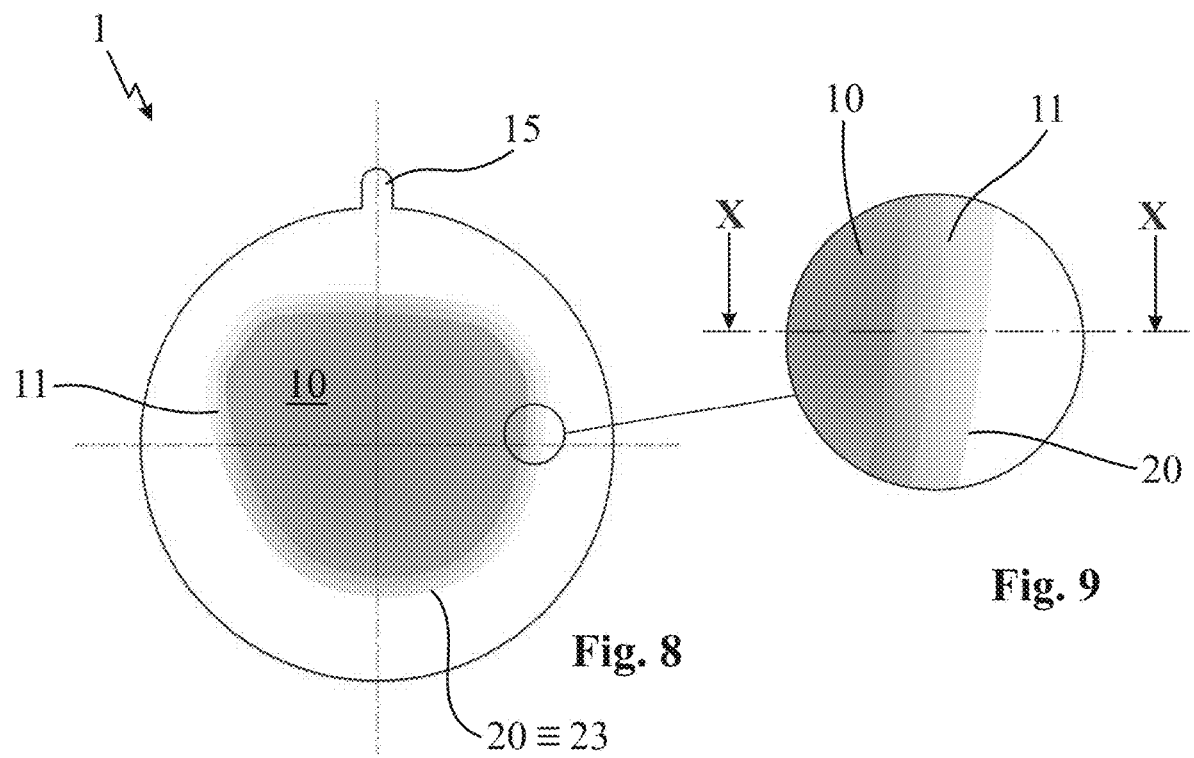
Fig. 8
Fig. 9
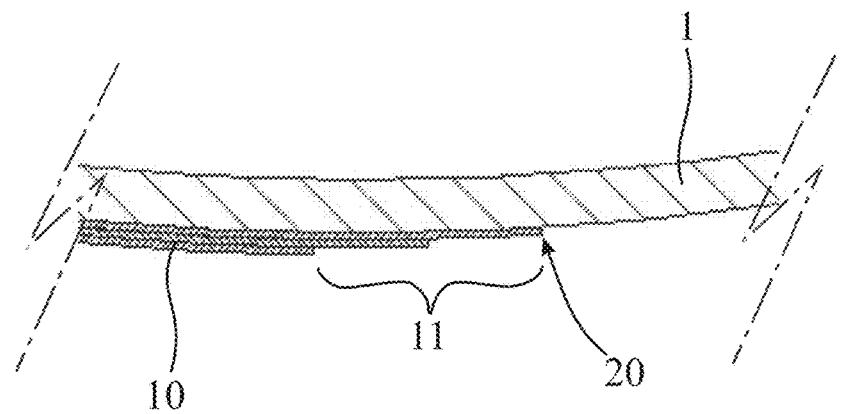
Fig. 10

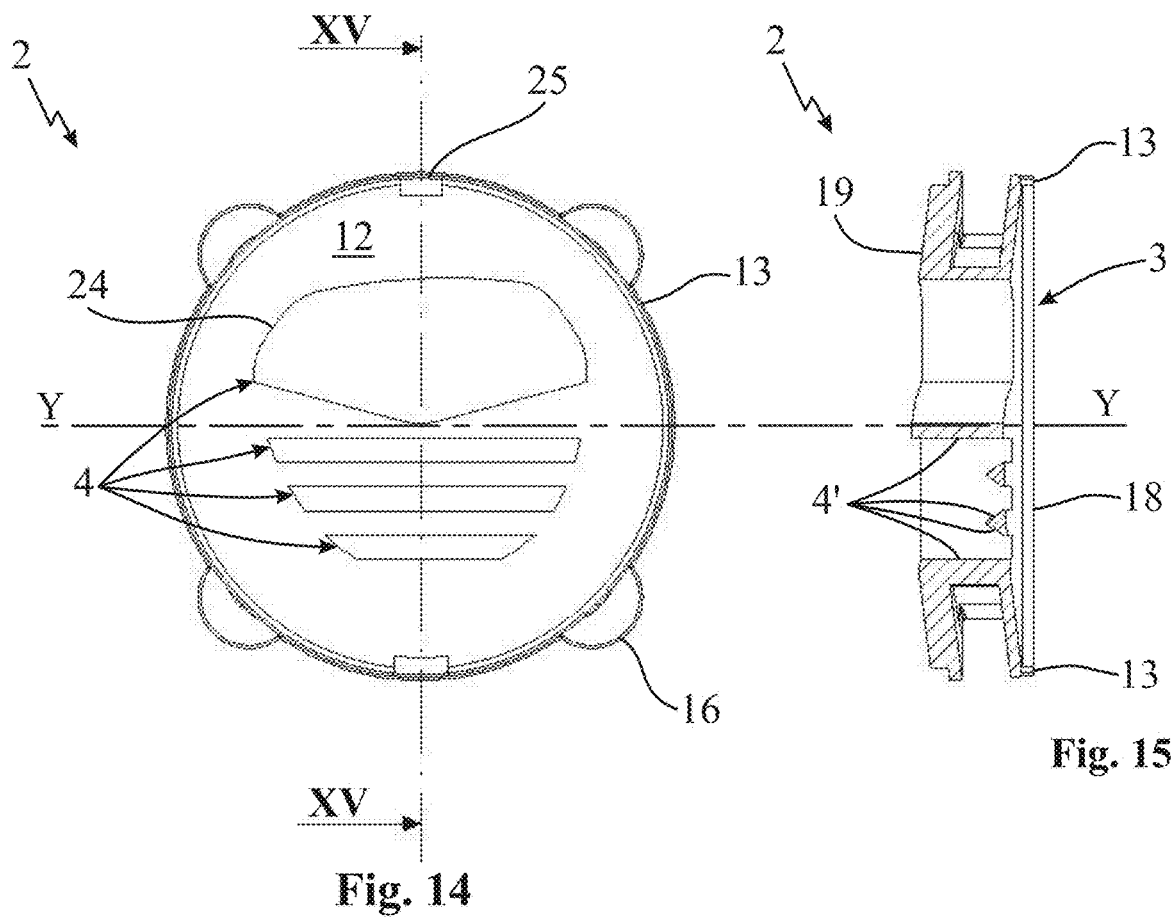
Fig. 14
Fig. 15
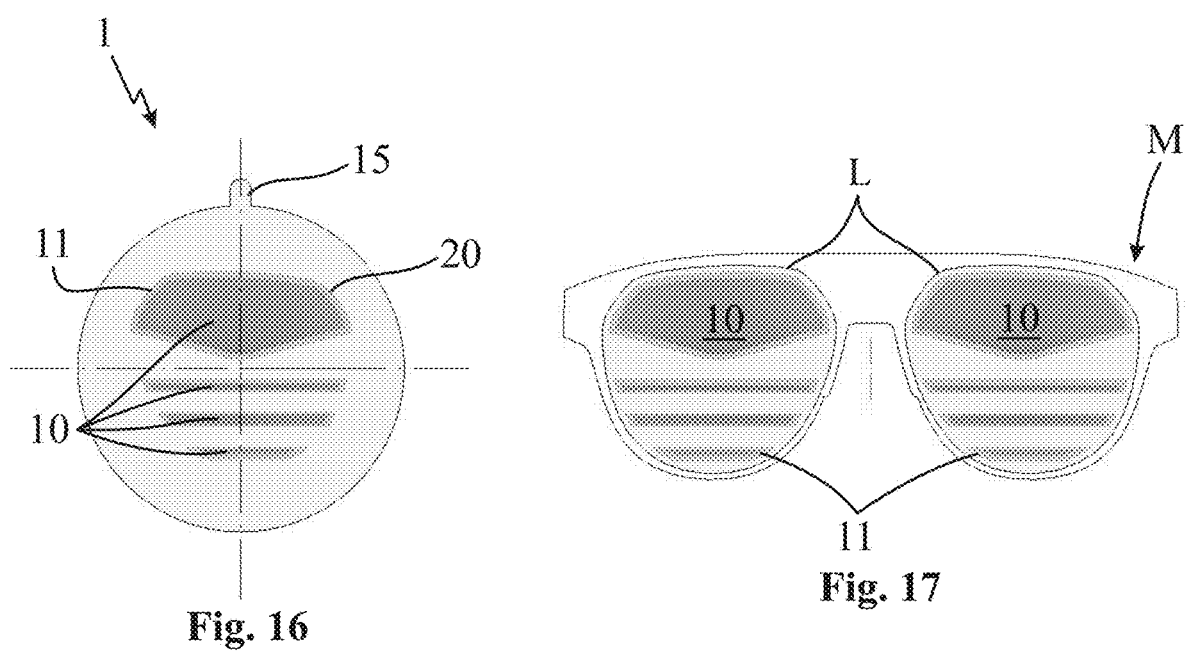
Fig. 16
Fig. 17

METHOD FOR MAKING AN EYEGLASS LENS COATED BY MEANS OF PHYSICAL VAPOR DEPOSITION PVD

FIELD OF APPLICATION

The present invention regards a method for making an eyeglass lens coated by means of physical vapor deposition PVD and a support body for a lens blank, according to the preamble of the respective independent claims.

The present method and support body are intended to be employed in the eyeglass field for making eyeglass lenses coated with a coating layer, in particular colored, and in particular eyeglass lenses coated with a mirrored coating layer.

Advantageously, moreover, the present support body is intended to be employed in the present method for making eyeglass lenses coated with a coating layer, such coating layer being shaped and oriented with respect to the perimeter edge of the coated eyeglass lens itself.

The invention is therefore inserted in the context of the industrial field of eyeglasses and production methods for making eyeglasses.

STATE OF THE ART

In order to render eyeglasses more externally pleasing, eyeglasses have been on the market for years with "mirrored" lenses, i.e. coated with a coating layer, which is susceptible of reflecting, like a mirror, the image of the surrounding environment over which the eyeglasses are directed.

Up to now, two methods are mainly known for making a mirrored lens, hereinbelow also termed "mirroring" methods, which provide for coating the eyeglass lens with a coating layer by means of physical vapor phase deposition, known in the technical jargon of the field also by its acronym PVD (physical vapor deposition). It is therefore the coating layer deposited in the aforesaid method to confer the mirrored coloring to the coated eyeglass lens.

In particular, a first mirroring method of known type provides for coating the eyeglass lens with a thin layer of metal material, which is provided with good light reflection qualities and thus confers the desired mirrored aspect to the lens.

A second mirroring method of known type provides for coating the lens with a thin film composed of multiple layers of different materials, and generally composed of multiple layers of two materials alternated with each other.

In particular, the materials used in such second mirroring method of known type are generally inorganic oxides, such as for example titanium dioxide ($TiO_2$), silicon dioxide ($SiO_2$), zirconium dioxide ($ZrO_2$), hafnium dioxide ($HfO_2$), aluminum oxide ($Al_2O_3$), silicon oxide (SiO) and magnesium oxide (MgO2), or they are inorganic salts, such as magnesium fluoride ($MgF_2$) and cerium fluoride ($CeF_2$).

The mirrored coloring obtained with such second mirroring method of known type is not due to the color of the material that forms the various layers (which in fact, if taken separately, are transparent or have whitish color) but instead is due to an optical effect of interference between the various components of the light that is reflected and refracted from every single layer.

More in detail, the various components of reflected and refracted light are susceptible of being added together, producing phenomena of optical interference that cause a light radiation reflected by the thin film, which is only centered on some wavelengths of the visible spectrum and hence allows perceiving a specific coloring of the thin film, which depends on the type of material that constitutes the various layers, on the number of superimposed layers and on the thickness thereof.

In particular, regarding the reflection and refraction characteristics of the different materials used, it is possible to size the various layers that constitute the thin film so as to obtain the desired mirrored coloring.

Both of the above-described mirroring methods provide for depositing, by means of a PVD process, at least one coating layer on the lens to be colored (whether this is the metal material layer or the multiple layers of different materials that constitute the thin film), which generally has a nanometric thickness.

More in detail, the PVD processes of known type generally occur within a mirroring chamber where a vacuum is made, in which the material that one wishes to deposit (such as zirconium, titanium or chromium in the case of deposition of the layer of metal material, or titanium oxide or silicon oxide in the case of deposition of the thin film) is arranged together with a lens blank to be coated in order to achieve the mirroring effect.

In particular, hereinbelow, with the term "lens blank" it is indicated a lens generally with circular shape and provided with greater size than the coated eyeglass lens that is obtained therefrom in order to be mounted on the frame of the eyeglasses.

In addition, hereinbelow, with the term "lens" it is intended a substantially transparent body, preferably made of plastic or glass, and substantially sheet-like, i.e. provided with a substantially negligible thickness with respect to its surface extension, which can be provided with two flat faces or with at least one curved face, and which is susceptible of being coated, on at least one of its faces, with a coating layer.

Advantageously, the aforesaid lens blanks allow standardizing the steps of producing and coating the eyeglass lenses, indeed such steps are executed on blanks with identical shape and size, which are subsequently cut into the desired eyeglass lens shape.

In particular, the abovementioned PVD processes of known type provide for arranging the material that one wishes to deposit on the lens in a suitable crucible arranged inside the mirroring chamber. Such material is then heated up to making it sublimate (or evaporate) in vapor phase, hence generating a flow of particles in vapor phase that is dispersed in the vacuum mirroring chamber.

The lens blanks are generally arranged in abutment seats made in suitable supports, for example of the type indicated in the 1 figure A, which are oriented so that the lenses intercept the flow of metal material in vapor phase. More in detail, the supports of known type generally have spherical cap shape and are positioned within the mirroring chamber with the crucible substantially at the center of such spherical cap.

In addition, the abutment seats of the supports are provided with a through opening susceptible of being crossed by the flow of particles in vapor phase which are dispersed starting from the crucible, so as to allow the deposition of the coating layer on the face of the lenses that closes such through opening.

Such methods of known type, employing PVD processes, have the advantage of making high-quality coated lenses, which benefit from a high abrasion, scratch and corrosion resistance, and also allow obtaining a wide chromatic variety based on the material that one intends to deposit. Such methods have however demonstrated in practice that they do not lack drawbacks.

One drawback of the aforesaid mirroring methods lies in the fact that the coloring, obtained with the coating layer, does not have a uniform distribution on the lens blank, but rather has a faded distribution, with an intensity and a coloring which vary from the perimeter edge of the lens blank towards the interior of the blank itself.

More in detail, the intensity and the coloring of the lens blanks coated with the methods of known type briefly described above are strongly linked to the thickness of the coating layers deposited by means of the PVD processes.

In particular, in the first mirroring method of known type, the intensity of the mirrored coloring is linked to the thickness of the metal material layer that is deposited on the lens blank, in which a thicker metal material layer often corresponds with a more significant and covering mirroring, while a thinner metal material layer corresponds with a less significant and less covering mirroring, at which the lens blank is more transparent.

Otherwise, in the second mirroring method of known type, it is the tonality of the coloring to be linked with the thickness of the thin film deposited on the lens.

As described above, in fact, the second mirroring method allows obtaining mirrored coloring with different colors in accordance with the thickness of the various layers that constitute the thin film, and hence, different colors correspond with different thicknesses.

The lens blanks coated with the methods of known type, employing PVD processes, are thus provided with a coating layer provided with thinner perimeter annular edge, whose coloring is faded as one moves radially away from the center of the lens blanks.

Such annular edge is due to the fact that the flow of particles in vapor phase (whether this is formed by metal material particles or by inorganic compound particles) is diffused in the mirroring chamber in a substantially random manner and the particles in vapor phase that constitute it can be intercepted by the centering template before hitting the lens blank.

Indeed, the flow of particles in vapor phase internally comprises particles directed towards the lens blank perpendicular to its surface and particles directed in a tilted manner with respect to the surface itself. In particular, the latter can be intercepted by the centering template and, in particular, by the perimeter walls which delimit the through openings thereof, which thus prevent such particles from reaching the lens blank.

In this manner, therefore, the perimeter walls of the through openings project a shadow cone on the lens blank, which is darker as one approaches the wall itself, and defines an annular portion of the through opening in which the particles in vapor phase that advance along tilted trajectories do not reach the lens blank but are intercepted by the centering template to an increasingly greater extent as one approaches the perimeter wall itself.

Consequently, the areas of the lens blank affected by such shadow cone (i.e. the perimeter edge of the lens blank, arranged in the vicinity of such perimeter walls) are covered by a coating layer of thinner thickness which generates such faded edge, with respect to the areas not intercepted by the shadow cone, i.e. with respect to a central area of the blank, which is not affected by the presence of the perimeter walls.

The extension of such perimeter edge depends on the height of the perimeter walls of the through hole, through which the flow of particles in vapor phase that intercepts the lens passes. More clearly, higher perimeter walls project more extensive shadow cones. In practice, such faded perimeter edge of the lens blank involves a considerable complication of the production methods known up to now regarding coated eyeglass lenses.

More in detail, the methods for producing coated lenses of known type provide for cutting the lens blank, excluding the faded edge so as to avoid the presence of even only one portion of the aforesaid faded edge in the cut eyeglass lens, which would be negatively perceived on the market. In addition, presently, the coating on the blank is distributed in a covering manner without accounting for the orientation of the blank. The consequent cutting step therefore does not account for the orientation of the blank during the coating step.

Presently, thin supports are known that are provided with shallow through openings so as to minimize the extension of the faded edge and attain lens blanks coated with a coating layer of uniform thickness, from which the eyeglass lens can be easily cut with the desired shape and coated in a uniform manner.

There is the particular need in the eyeglass field to have eyeglasses on the market that are provided with external/aesthetic characteristics that are particularly appreciated by consumers.

On this matter, in any case, the faded edge on the lens blanks that is attained with the above-described methods of known type cannot be currently employed for conferring an appreciable aesthetic effect to the lenses. Moreover, more generally, it is not known to easily account for the position of the lens blank during the coating step with respect to the support for obtaining oriented design shapes on the lens blank, that are then cut by following the shape of the design and accounting for the form of the lens to be attained.

PRESENTATION OF THE INVENTION

In this situation, the problem underlying the present invention is therefore that of overcoming the drawbacks shown by the methods of known type, by providing a method for making an eyeglass lens coated by means of physical vapor deposition PVD and a support body employable in such method which allow easily obtaining designs with oriented shape on the lenses.

A further object of the present invention is to provide a method for coating eyeglass lenses that allows obtaining a faded edge effect which is arranged within the final lens and which is simultaneously aesthetically appreciable.

A further object of the present invention is to provide a method for coating eyeglass lenses which allows obtaining a faded effect which designs desired shapes and geometries.

A further object of the present invention is to provide a method for coating eyeglass lenses which is simple to achieve.

A further object of the present invention is to provide a method for coating eyeglass lenses which can be easily implemented, starting from the methods of known type.

A further object of the present invention is to provide a method for coating eyeglass lenses which can be implemented with already-existing instrumentation and with the addition of a support body, object of the present invention.

A further object of the present invention is to provide a support body employable in such method for making coated eyeglass lenses, which is inexpensive to make and simple to use and allows making oriented designs on the lenses.

BRIEF DESCRIPTION OF THE DRAWINGS

The technical characteristics of the invention, according to the aforesaid objects, are clearly seen in the contents of the below-reported claims and the advantages thereof will be more evident in the following detailed description, made with reference to the enclosed drawings, which represent a merely exemplifying and non-limiting embodiment of the invention, in which:

FIG. 8 shows a lens blank coated with the method, object of the present invention;

FIG. 9 shows an enlargement of FIG. 8, in which it is possible to appreciate the faded edge of the coating layer deposited on the lens blank;

FIG. 10 shows a section of the lens blank coated with the present method, made along the trace X-X of FIG. 9, in which it is possible to appreciate the different thicknesses of the coating layer;

FIG. 14 shows a front view of a second embodiment of the support body, object of the present invention;

FIG. 15 shows a sectional view of the support body of FIG. 14, made along the trace of section XV-XV of FIG. 14;

FIGS. 16 and 17 respectively show a lens blank coated with the present method, in which the support body of FIG. 14 was employed, and a pair of eyeglasses provided with a pair of coated lenses obtained from two lens blanks of the type indicated in FIG. 16;

DETAILED DESCRIPTION OF A PREFERRED EMBODIMENT

Figure 1A:
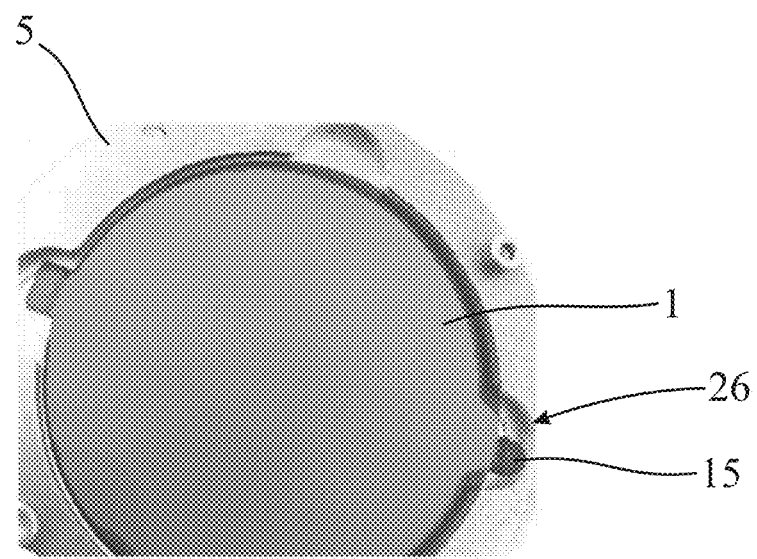
FIG. 1A shows a prior art support for lens blanks.

The method for making a coated eyeglass lens, object of the present invention, will be described hereinbelow with reference to means for the making thereof and in particular with reference to a support body for a lens blank, also forming the object of the present invention.

The method and the support body that will be discussed hereinbelow are intended for making lenses coated by means of physical vapor deposition PVD, in which a coating layer 10 is deposited on a lens blank 1, from which the desired coated lens (also indicated hereinbelow with the expression "final lens L") is intended to be obtained.

In particular, the present method is adapted to coat the lens blank 1 with the coating layer 10 shaped in many different forms.

Furthermore, the coating layer 10 deposited with the present method is suitably oriented along the blank of lens 1, i.e. it is deposited at a desired position known a priori, in order to obtain a desired aesthetic effect. In particular, the present method advantageously allows to deposit the coating layer 10 at a certain position inside a final lens L which is desired to be obtained starting from the blank of lens 1 coated with the aforementioned coating layer 10.

In particular, in the course of this description, the term "oriented" will mean that an object is positioned in a predetermined position, known with respect to a specific reference center.

Preferably, moreover, the coating layer 10 deposited with the present method is provided with a "mirrored" coloring, i.e. susceptible of reflecting, like a mirror, the image of the surrounding environment over which the eyeglasses are directed. Of course, it is intended that the aforesaid coating layer 10 can also be provided with a non-mirrored coloring, without departing from the scope of the present patent.

The method, object of the present invention, comprises a step of arranging a lens blank 1 provided with at least one first centering reference 15.

In particular, the lens blank 1 is advantageously of the type known in the eyeglass field for the production of eyeglass lenses and especially for the production of colored lenses for sunglasses, or lenses that are ophthalmic and colored for graduated sunglasses.

Advantageously, the present lens blanks 1 are made of the different materials used today on the market for producing lenses, such as of plastic/organic material or of glass, in particular mineral glass.

In addition, in accordance with the enclosed figures, the first centering reference 15 is advantageously attained in the form of a tooth projecting from the lens blank 1, and preferably it is attained in the form of two teeth projecting from the lens blank 1, e.g. at two diametrically-opposite positions of the aforesaid lens blank 1. Advantageously, in the aforesaid embodiment in which the lens blank 1 is provided with two projecting teeth, each projecting tooth is adapted to act as first centering reference 15.

Figure 3:
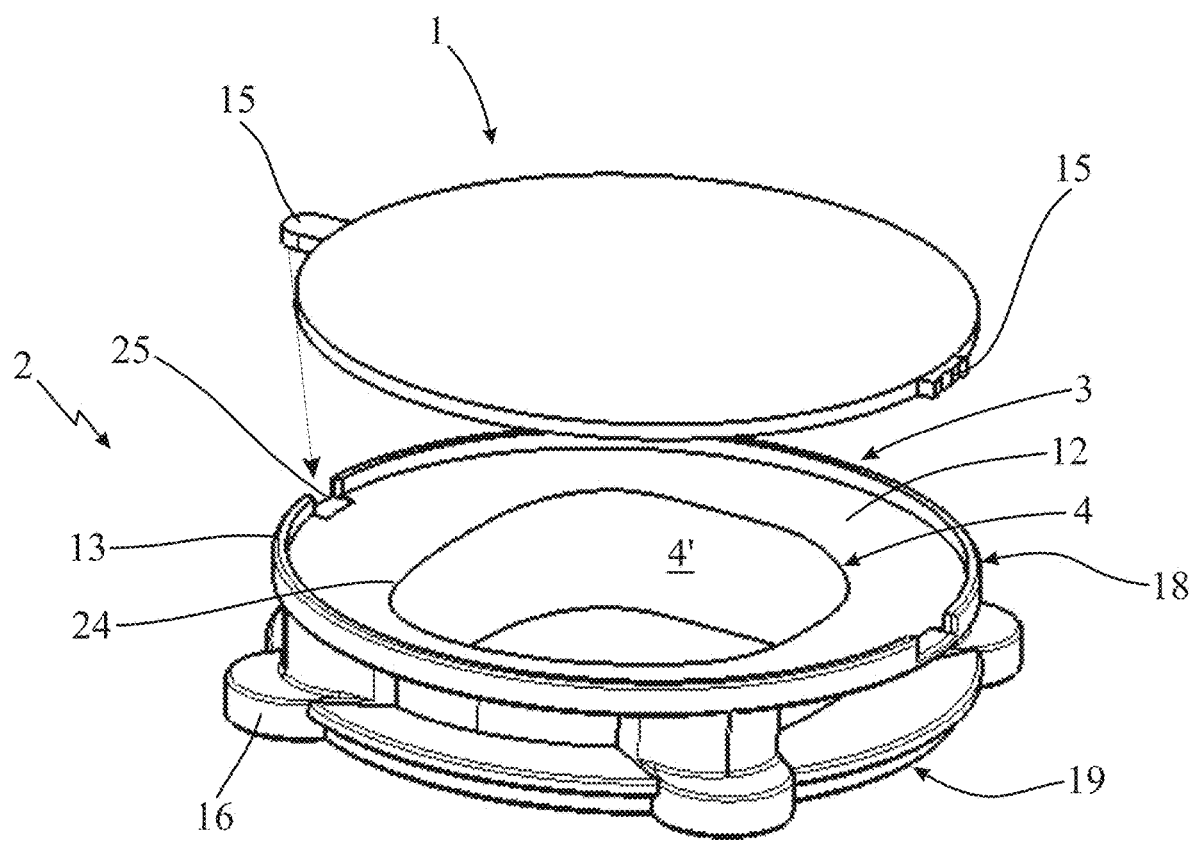
FIG. 3 shows a perspective view of a first embodiment of a support body, object of the present invention, and of a lens blank associable with the aforesaid support body.

The method, object of the present invention, also provides for a step of arranging a support body 2 for the lens blank 1, as can be appreciated for example in FIG. 3.

More in detail, such support body 2 is provided with a first abutment seat 3 adapted to house the lens blank 1, which is thus preferably counter-shaped with respect to the lens blank 1 itself in order to retain it at its interior by means of shape coupling.

The support body 2 is also provided with at least one second centering reference 25 with respect to which the first centering reference 15 of the lens blank 1 is susceptible of being oriented, which is intended to be housed in the first abutment seat 3.

In particular, the aforesaid centering reference 25 is advantageously attained in the form of a sunken female seat made in the support body 2, and preferably sunken starting from the first abutment seat 3. In accordance with the enclosed figures, moreover, the female seat of the centering reference 25 is advantageously counter-shaped with respect to the first centering reference 15 and is adapted to be engaged via shape coupling with the latter.

Advantageously, in the embodiment in which the lens blank 1 is provided with two first centering references 15 made in the form of two projecting teeth, the support body 2 is provided with two second centering references 25 made in the form of two female seats susceptible of housing the two projecting teeth.

Of course, also to be intended as the object of the present invention is the opposite embodiment solution, in which the first centering reference 15 is made in the form of a sunken female seat in the lens blank 1 and the second centering reference 25 is made in the form of a tooth projecting from the support body 2, and in particular projecting inside the first abutment seat 3 in order to be engaged via shape coupling with the female seat of the lens blank 1.

According to the invention, the support body 2 is also provided with at least one first shaped and through opening 4, which is oriented with respect to the second centering reference 25 in the sense that the relative position thereof is defined and known.

Figure 5:
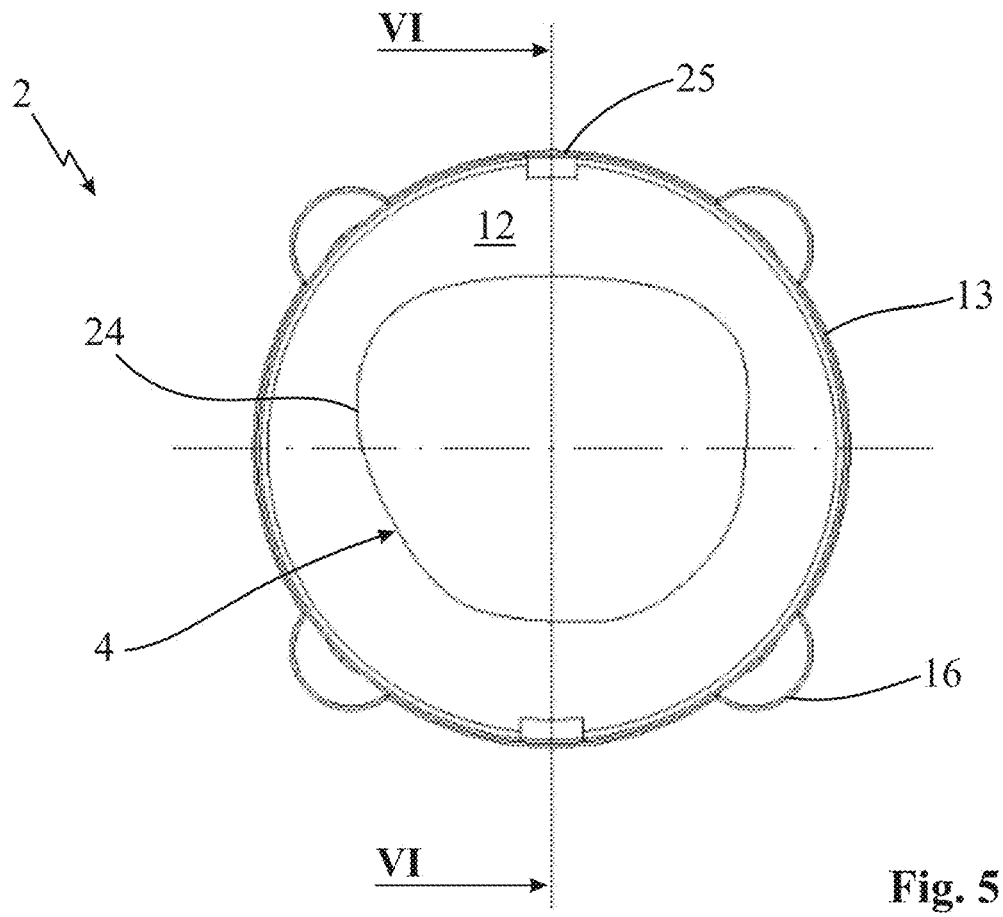
FIG. 5 shows a front view of the support body of FIG. 3.
Figure 6:
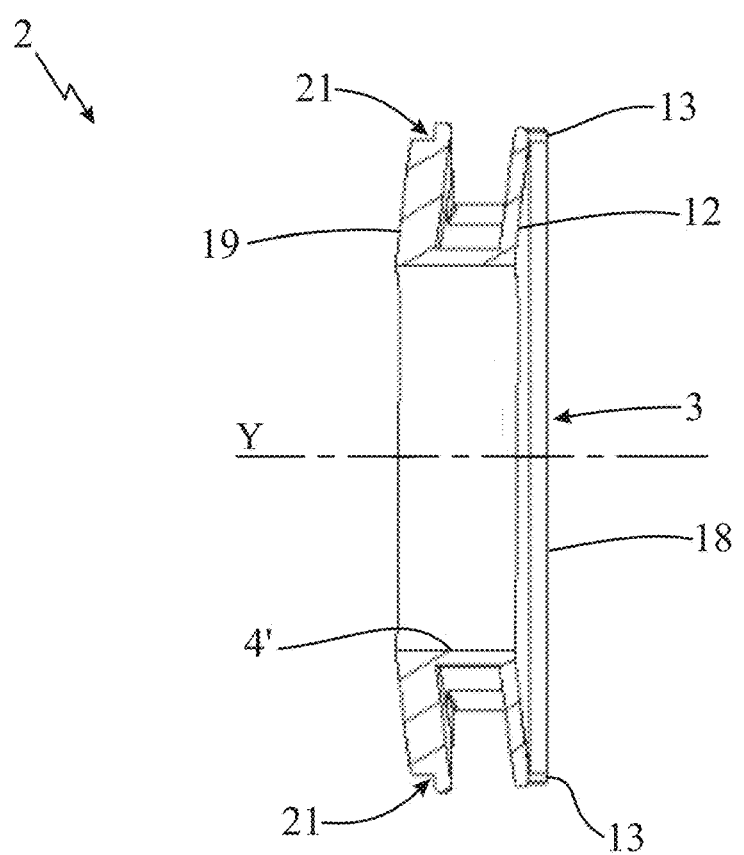
FIG. 6 shows a sectional view of the support body of FIG. 5, made along the trace of section VI-VI of FIG. 5.
Figure 18:
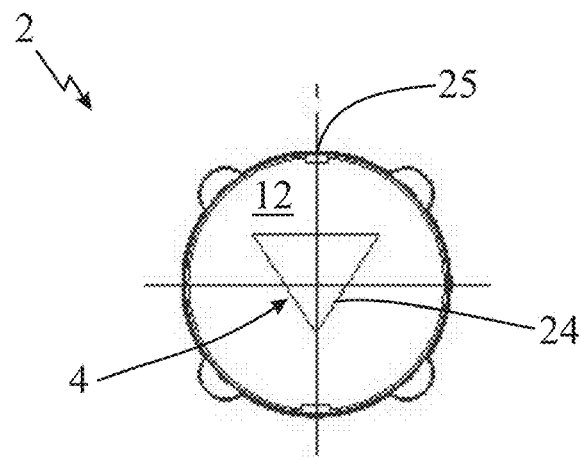
FIGS. 18, 19 and 20 respectively show a front view of a third embodiment of the support body, object of the present invention, of a lens blank coated with the present method, in which the support body of FIG. 18 was employed, and of a pair of eyeglasses provided with a pair of coated lenses obtained from two lens blanks of the type indicated in FIG. 19.
Figure 19:
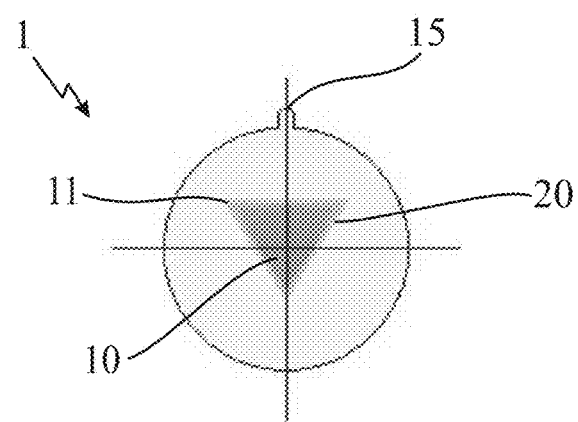
Figure 20:
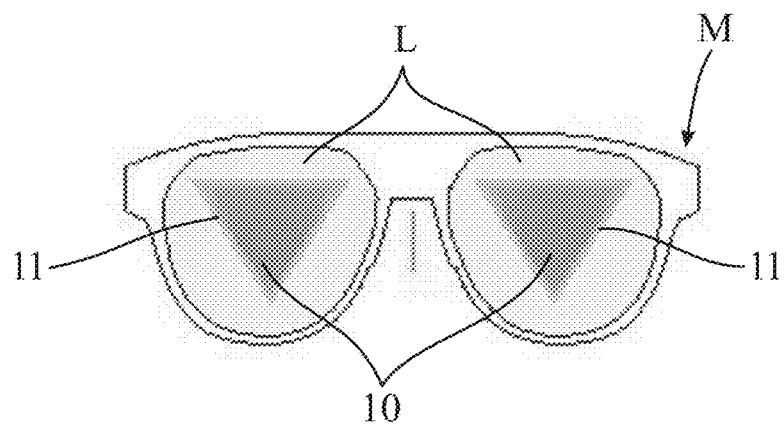

More in detail, the first shaped and through opening 4 is advantageously delimited by at least one perimeter wall 4', which is extended in a manner passing through the support body 2 starting from a first bottom wall 12 of the first abutment seat 3, as is for example indicated in the enclosed FIGS. 3, 5 and 18.

Advantageously, in accordance with a second embodiment of the support body 2, represented in FIGS. 14 and 15, the first abutment seat 3 is provided with a plurality of first through openings 4, which are delimited by a plurality of perimeter walls 4' arranged in an angled manner with respect to each other.

In accordance with the enclosed figures, the support body 2 has substantially cylindrical form (being intended that it preferably has an axial extension like a projection of a flat figure along an axis) and is extended along a longitudinal axis Y between an upper face 18, from which the first abutment seat 3 is obtained, and an opposite lower face 19. In particular, the perimeter walls 4' of each first shaped and through opening 4 are preferably extended between the first bottom wall 12 of the first abutment seat 3 and the lower face 19 of the support body 2 for a predefined height.

More in detail, in accordance with a first embodiment of the aforesaid support body 2, illustrated in the enclosed FIGS. 6 and 7A-C, such predefined height preferably coincides with the difference between the height of the support body 2, defined between its upper and lower faces 18, 19, and the depth of the first abutment seat 3 defined by the distance between the upper face 18 and the first bottom wall 12. In accordance with a second embodiment of the support body 2, illustrated in the enclosed FIG. 15, several perimeter walls 4' are extended starting from the bottom wall 12 of the first abutment seat 3 for a reduced height with respect to the predefined height between the first bottom wall 12 of the first abutment seat 3 and the lower face 19 of the support body 2.

Advantageously, the perimeter walls 4' of each first shaped and through opening 4 have a predefined tilt with respect to the longitudinal axis Y of the support body 2. More in detail, in accordance with the first embodiment illustrated in the enclosed FIGS. 6 and 7A-C, the perimeter walls 4' of each first shaped and through opening 4 are substantially extended parallel to the longitudinal axis Y of the support body 2. Otherwise, in accordance with the second embodiment illustrated in the enclosed FIG. 15, several first through openings 4 are widened towards the lower face 19, being delimited by perimeter walls 4' arranged in a tilted manner with respect to the longitudinal axis Y of the support body 2.

Advantageously, moreover, the perimeter walls 4' of each first shaped and through opening 4 are arranged along a shaped profile 24 which confers a pre-established shape (design) to the first shaped and through opening 4.

Advantageously, the shape of the first shaped and through opening 4 is provided with variable shapes and sizes based on the aesthetic effect that one wishes to obtain on the lens blank 1 with the method, object of the present invention, as better specified hereinbelow.

In particular, in accordance with the first embodiment of the support body 2, illustrated in the enclosed FIGS. 3-7C, the first shaped and through opening 4 is advantageously shaped in the form of an eyeglass lens, and in particular is shaped in the form of the final lens L that one wishes to attain. More clearly, the first shaped and through opening 4 substantially has the shape and size of a specific final lens L intended to be mounted on a specific eyeglass frame M.

Advantageously, in such first embodiment, the shape of the first shaped and through opening 4 can thus vary based on the eyeglass model on which the final lens L is intended to be mounted. For example, the first shaped and through opening 4 can have drop form, or be substantially circular, rectangular, trapezoidal or have yet another shape. Advantageously, moreover, the first shaped and through opening 4 can be shaped in right lens or left lens form in order to be mounted on eyeglasses provided with final lenses L, mirrored with respect to the nosepiece, as is for example represented in the enclosed FIG. 13.

Otherwise, the first shaped and through opening 4 can be shaped in the form of an eyeglass lens that does not coincide with the form of the final lens L. For example, the first shaped and through opening 4 can be attained in the same form as the final lens L but it can be provided with a different size.

Otherwise, additionally, the first shaped and through opening 4 can be shaped in forms and sizes that do not coincide with the shape of the final lens L intended to be mounted on the eyeglass frame M, e.g. it can be shaped in strip form (in accordance with the second embodiment illustrated in the enclosed FIGS. 14, 15) or in triangle form (in accordance with the third embodiment illustrated in FIG. 18) or in still other forms without departing from the protective scope of the present patent.

In particular, in each above-described embodiment, the aforesaid first shaped and through openings 4 are oriented with respect to the second centering reference 25 and preferably are centered with respect to the first abutment seat 3.

According to the invention, the present method also comprises a step of arranging a centering template 5 provided with at least one second abutment seat 6, adapted to house the support body 2, and with at least one second through opening 7 preferably open on the second abutment seat 6, as indicated hereinbelow.

Advantageously, the centering template 5 arranged in the present method can be of the type already known for housing the lens blanks 1 for known coating methods, so as to be easily found on the market.

Figure 1B:
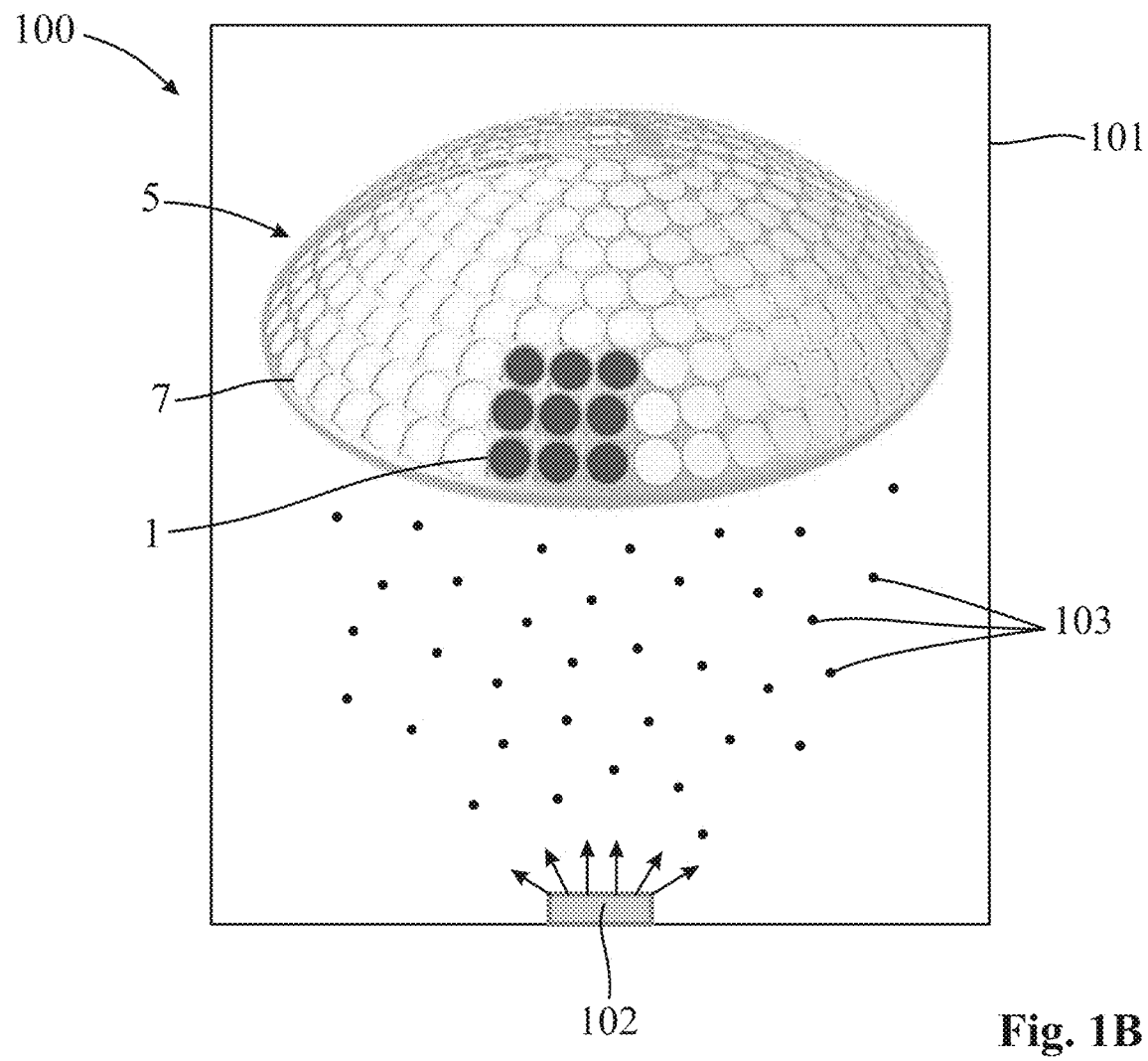
FIG. 1B shows a schematic view of a PVD apparatus intended to be employed in the method for making coated eyeglass lenses, object of the present invention.
Figure 2:
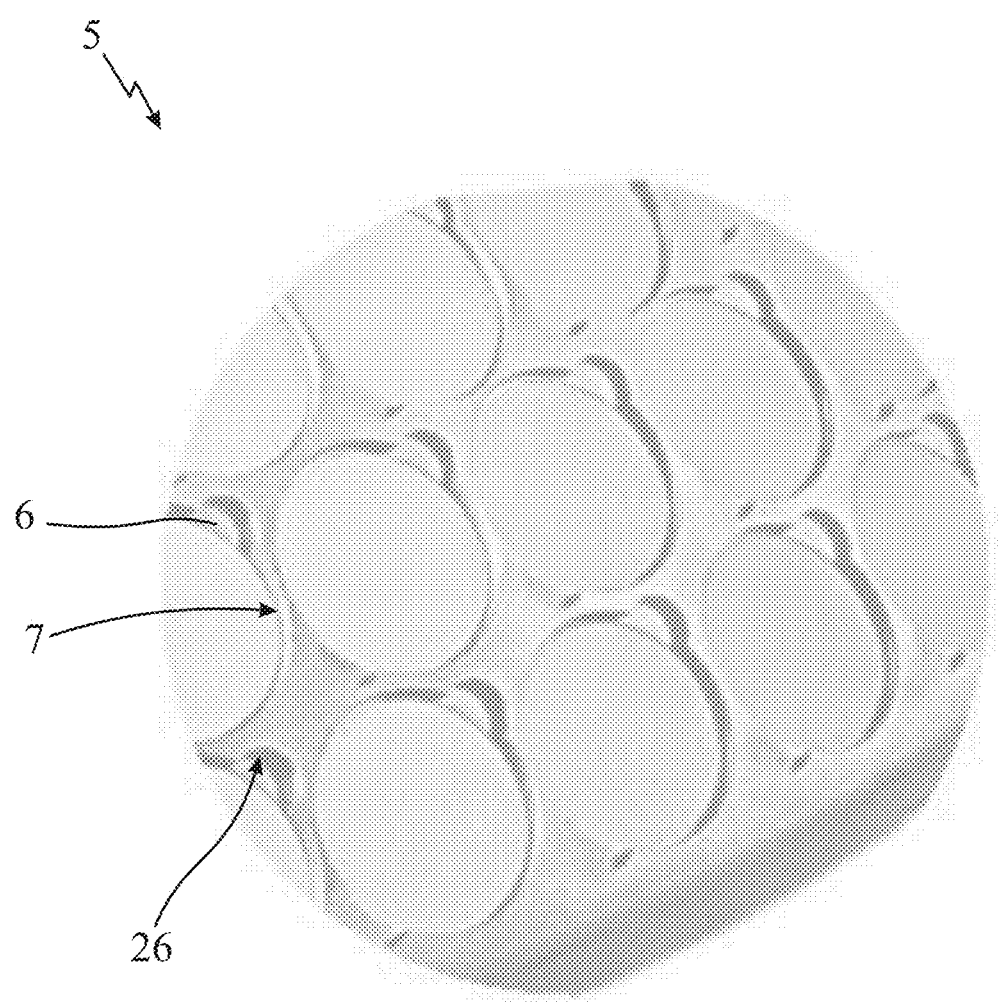
FIG. 2 shows an enlargement of FIG. 1, in which it is possible to appreciate the abutment seats of a centering template employed in the method according to the present invention.

For example, the centering template 5 is advantageously obtained with a wall shaped in the form of a spherical cap, having a convex external surface and a concave internal surface, and on such wall, a plurality of the aforesaid second abutment seats 6 are made as illustrated in the enclosed FIGS. 1B and 2.

In particular, each second abutment seat 6 is extended starting from the external surface of the centering template 5 up to a second bottom wall, against which the lens blank 1 according to already-known methods (as indicated in the enclosed figure 1A) or the support body 2 (as indicated in the enclosed FIG. 4) according to the method, object of the present invention, is susceptible of abutting.

In accordance with the enclosed FIG. 2, at each second abutment seat 6, a corresponding second through opening 7 is also arranged, preferably centered with respect to the first shaped and through opening 4 of the support body 2 intended to be housed in the second abutment seat. Advantageously, moreover, each second through opening 7 is extended between the second bottom wall of the second abutment seat 6 up to the opposite internal surface of the centering template 5 in spherical cap form.

The method, object of the present invention, also comprises an assembly step, in which the lens blank 1 is housed in the first abutment seat 3 of the support body 2 to close the first shaped and through opening 4.

In particular, due to the aforesaid assembly step, the lens blank 1 is arranged with an internal face thereof directed towards the first shaped and through opening 4 and partially in abutment (at its peripheral edge) against the bottom wall 12 of the first abutment seat 3 of the support body 2.

In addition, in the aforesaid assembly step, the lens blank 1 is housed in the first abutment seat 3, orienting the first centering reference 15 with respect to the second centering reference 25, i.e. in other words arranging the lens blank in a known position with respect to the support body 2 due to the mutual orientation between the two centering references 15 and 25.

More clearly, with the term "orient" it must be intended that the lens blank 1 is housed in the first abutment seat 3 with its first centering reference 15 arranged in a position that is predefined and known with respect to the second centering reference 25. For example, in accordance with the above-described preferred embodiment, in which the first and the second centering reference 15, 25 are attained in the form of projecting tooth and female seat, in the assembly step the lens blank 1 is housed in the first abutment seat 3 with its projecting tooth inserted in the female seat of the support body 2. Or, in accordance with a different embodiment, the first and the second centering reference 15, 25 are attained in the form of reference notches respectively made on the lens blank 1 and on the support body 2 and, in the assembly step, the lens blank 1 is housed in the first abutment seat 3 with its reference notch facing towards the reference notch of the support body 2. Or, in accordance with a further different embodiment, the first and the second centering reference 15, 25 are defined by the perimeter shape of the lens blank 1 and of the first abutment seat 3 that are counter-shaped with respect to each other and, in the assembly step, the lens blank 1 is oriented such that it can be inserted to size in the first abutment seat 3.

Figure 7A:
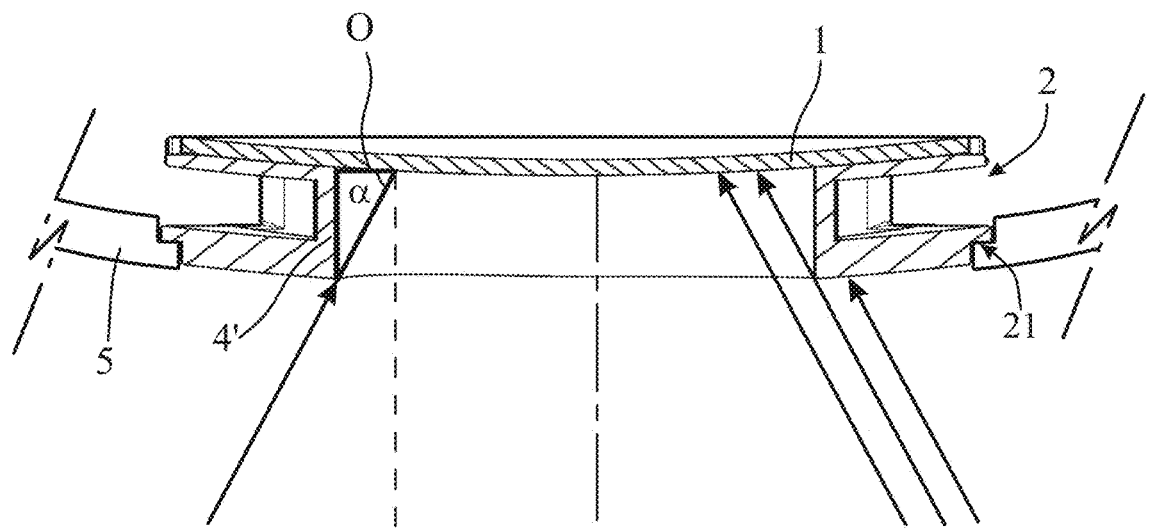
FIG. 7A, 7B, 7C show three sections of three present support bodies, of the type indicated in FIG. 6, supporting a lens blank and provided with through openings delimited by perimeter walls extended for different depths.
Figure 7B:
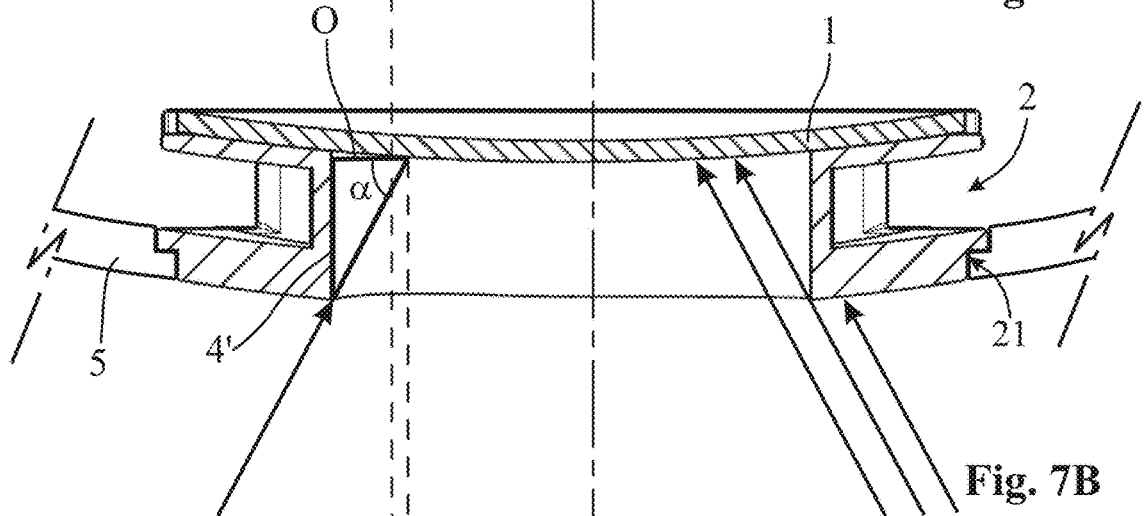
Figure 7C:
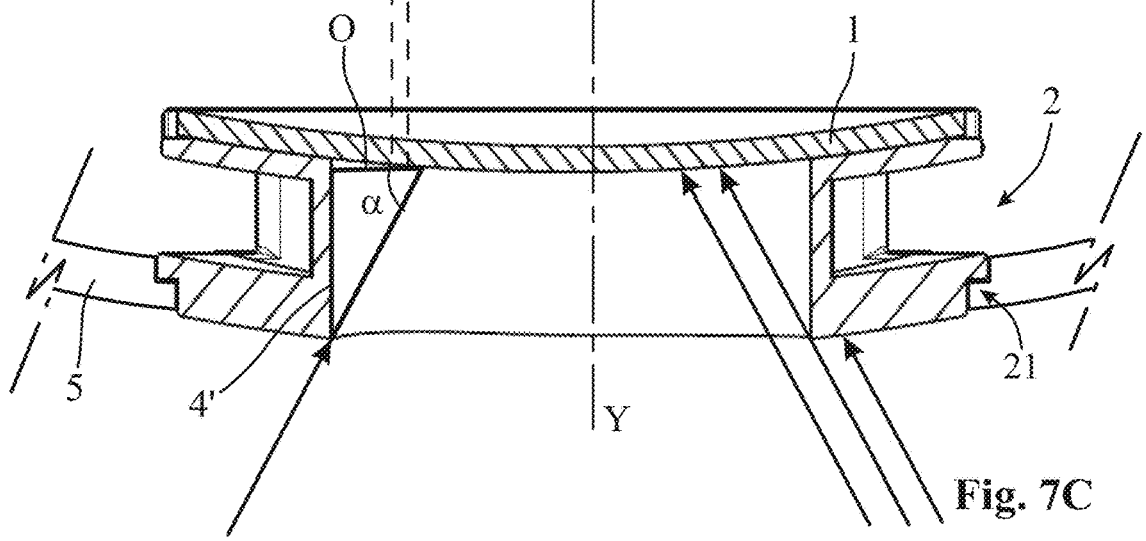

The aforesaid assembly step also provides for housing the support body 2 in the second abutment seat 6 of the centering template 5 with the first shaped and through opening 4 and the second through opening 7 substantially aligned with each other (see the enclosed FIGS. 7A-C).

Advantageously, the support body 2 is provided with a peripheral profile suitably counter-shaped with respect to the second abutment seat 6 such that it can be inserted to size in such second abutment seat 6 and retained at its interior via shape coupling.

In particular, the support body 2 is preferably provided with at least one third centering reference 16 and the centering template 5 is provided with at least one fourth centering reference 26. Hence, in operation, in the assembly step the support body 2 is housed in the second abutment seat 6, orienting the third centering reference 16 with respect to the fourth centering reference 26.

Figure 4:
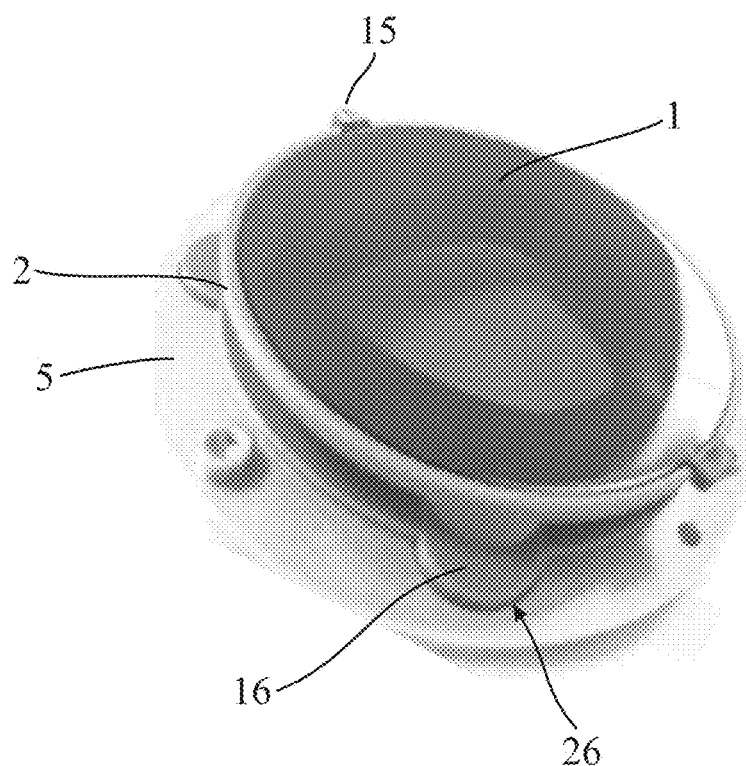
FIG. 4 shows the support body of FIG. 3 housed in one of the abutment seats of FIG. 2, in accordance with the method, object of the present invention.

For example, in accordance with the preferred embodiment illustrated in the enclosed figures, the third centering reference 16 is made in the form of a projecting ear and the fourth centering reference 26 is made in the form of a female seat counter-shaped with respect to the projecting ear, which is adapted to house the latter and preferably to retain it via shape coupling (see for example FIG. 4).

Preferably, moreover, the support body 2 is provided with two or more third centering references 16, for example it is provided with four projecting ears as indicated in the enclosed figures, and the centering template 5 is provided with two or more corresponding fourth centering references 26 and, in particular, is provided with a number of fourth centering references 26 at least equal to the number of the third centering references 16, e.g. it is provided with four female seats.

Preferably, moreover, the support body 2 is provided with a step 21 that is sunken starting from its peripheral profile at the lower face 19 (see FIG. 6), which is susceptible of abutting against a corresponding perimeter wall of the second through opening 7 of the centering template 5, as indicated in the enclosed FIGS. 7A, 7B and 7C. Advantageously, in accordance with the preferred embodiment illustrated in FIGS. 7A-C, the support body 2 is partially housed inside the second through opening 7 of the centering template 5 with the first shaped and through opening 4 and the second through opening 7 which have a section of their axial extension in common.

Preferably, moreover, the aforesaid assembly step provides for mounting multiple support bodies 2 on the centering template 5; each of such support bodies 2 is housed in a corresponding second abutment seat 6 and is susceptible of housing a corresponding lens blank 1 (see FIG. 1B).

According to the idea underlying the present invention, the present method also comprises at least one step of coating the lens blank 1 by means of physical vapor deposition PVD, in which a flow of particles in vapor phase is directed towards the lens blank 1, through the second through opening 7 and through the first shaped and through opening 4, and is deposited on the lens blank 1, forming a coating layer 10 thereon.

In particular, the particles in vapor phase employed in the aforesaid coating step can advantageously be made of any one material that can be deposited by means of PVD process, i.e. any one material that is solid at room temperature and pressure, which is susceptible of passing from the solid state to the vapor state and vice versa only by means of physical transformations.

Advantageously, the particles in vapor phase employed in the coating step are made of materials per se provided with a mirrored coloring (such as metal materials), or they are made of materials susceptible of reflecting the light that hits thereon, creating phenomena of optical interference such to reproduce a mirrored coloring (such as inorganic salts or oxides).

More in detail, metal materials employable in the present method are for example zirconium (Zr), titanium (Ti) and chromium (Cr). In addition, employable inorganic oxides are for example titanium dioxide (TiO2), silicon dioxide (SiO2), zirconium dioxide (ZrO2), hafnium dioxide (HfO2), aluminum oxide (Al2O3), silicon oxide (SiO) and magnesium oxide (MgO2). In addition, employable inorganic salts are for example magnesium fluoride (MgF2) and cerium fluoride (CeF2). Of course the above-reported list of materials is to be intended as non-exhaustive or non-limiting of the present invention and further metal materials, and inorganic salts or oxides can be employed in the aforesaid step of coating by means of PVD processes without departing from the scope of the present patent.

In operation, the aforesaid coating step occurs within a mirroring chamber 101 of an apparatus for vapor phase physical deposition 100 (hereinbelow indicated with its acronym PVD). In particular, the PVD apparatus 100 intended to be employed in the present method is advantageously an apparatus of type known to the man skilled in the art and therefore not described in detail hereinbelow.

In particular, the coating step provides for arranging the lens blank 1, associated with the support body 2 and the centering template 5, in the mirroring chamber 101 of the PVD apparatus 100 together with one or more materials to be deposited on the lens blank 1, e.g. of the type indicated above.

In operation, such coating step provides for bringing the mirroring chamber 101 under vacuum, or in any case to a pressure lower than or equal to $10^{-2}$ mbar and preferably to a pressure lower than or equal to $10^{-4}$ mbar.

In addition, the coating step provides for heating the material to be deposited until it is brought to vapor phase. In particular, such heating of the material to be deposited is advantageously attained by means of electrical heating elements, such as heating elements arranged at a crucible 102 of the material to be deposited itself, and such heating elements are adapted to heat the material to be deposited by Joule effect.

The heated material to be deposited is then susceptible of passing to the vapor phase in the form of the aforesaid particles in vapor phase, which tend to be expanded in the mirroring chamber 101 under vacuum, creating the flow of particles in vapor phase.

Advantageously, the particles in vapor phase are also susceptible of condensing substantially instantaneously when they contact into contact with the lens blank 1, which is preferably maintained at a temperature considerably lower than the temperature of the particles in vapor phase, which, thus condensing, deposit the coating layer 10.

Preferably, moreover, the coating step is extended for a time period comprised between 30 and 60 minutes and preferably for about 45 minutes, i.e. up to obtaining the coating layer 10 provided with a desired average thickness, and in particular with an average thickness comprised between several tens and several hundreds of nanometers.

According to the invention, the coating layer 10 deposited in the aforesaid coating step is provided with an exposed profile 20 with shape substantially coinciding with the first shaped and through opening 4 and preferably with size smaller than the entire lens blank 1.

Indeed in operation, as indicated above, the flow of particles in vapor phase is susceptible of condensing substantially instantaneously when it comes into contact with a surface at a temperature considerably lower than its own, depositing the coating layer 10. Then, only the fraction of the flow of particles in vapor phase, that impacts the portion of the lens blank 1 placed to close the first shaped and through opening 4, is susceptible of being deposited on the lens blank 1, thus defining the exposed profile 20 of the coating layer 10 substantially counter-shaped with respect to the shaped profile 24 of the first shaped and through opening 4 itself. In this manner, it is thus possible to obtain the coating layer 10 shaped according to the desired shapes and sizes, i.e. shaped according to the desired shapes and sizes of the first shaped and through opening 4.

Advantageously, moreover, in accordance with the embodiment represented in the enclosed FIGS. 14-17, the support body 2 can be provided with a plurality of first shaped and through openings 4 and consequently the coating layer 10 can comprise a plurality of exposed profiles 20 with shape substantially coinciding with the plurality of first shaped and through openings 4.

According to the idea underlying the present invention, the present method also comprises a cutting step in which the lens blank 1 is cut along a cutting profile 23 which is shaped in the form of eyeglass lens and preferably is shaped in a form coinciding with the form of the final lens L that one wishes to obtain.

Figure 11:
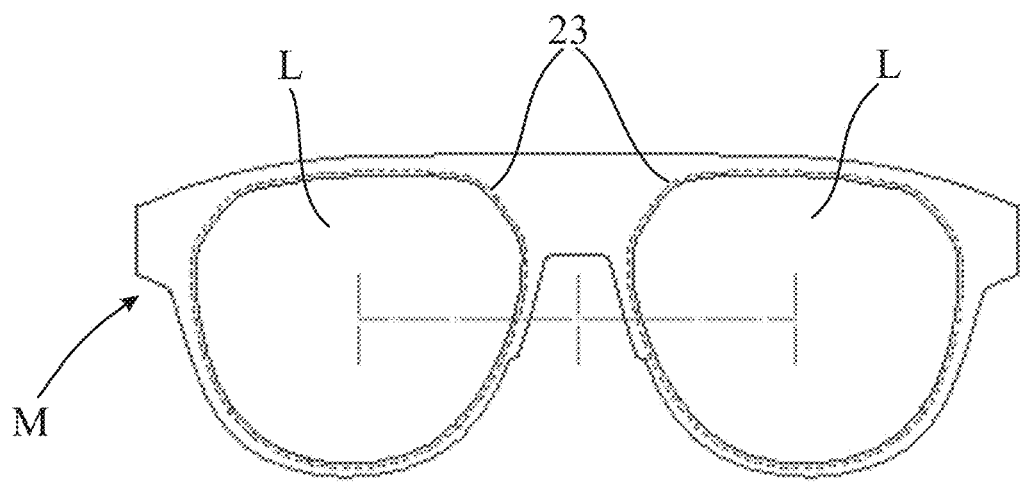
FIGS. 11 and 12 show the steps of designing the support body, object of the present invention.

According to the invention, moreover, the aforesaid cutting profile 23 (indicated with dashed line in FIG. 11 and in FIG. 21) is oriented with respect to the first centering reference 15 of the lens blank 1 so as to cut the lens blank 1, accounting for the position of the shape of the coating layer 10.

Indeed, as indicated above, the first centering reference 15 is oriented with respect to the second centering reference 25 of the support body 2, with respect to which the shaped profile 24 of the first shaped and through opening 4 is oriented, which in turn coincides with the exposed profile 20 of the coating layer 10.

Consequently, also the cutting profile 23 is oriented with respect to the exposed profile 20 of the reference layer 10 and preferably coincides with the latter as indicated in the enclosed FIG. 8.

Figure 21:
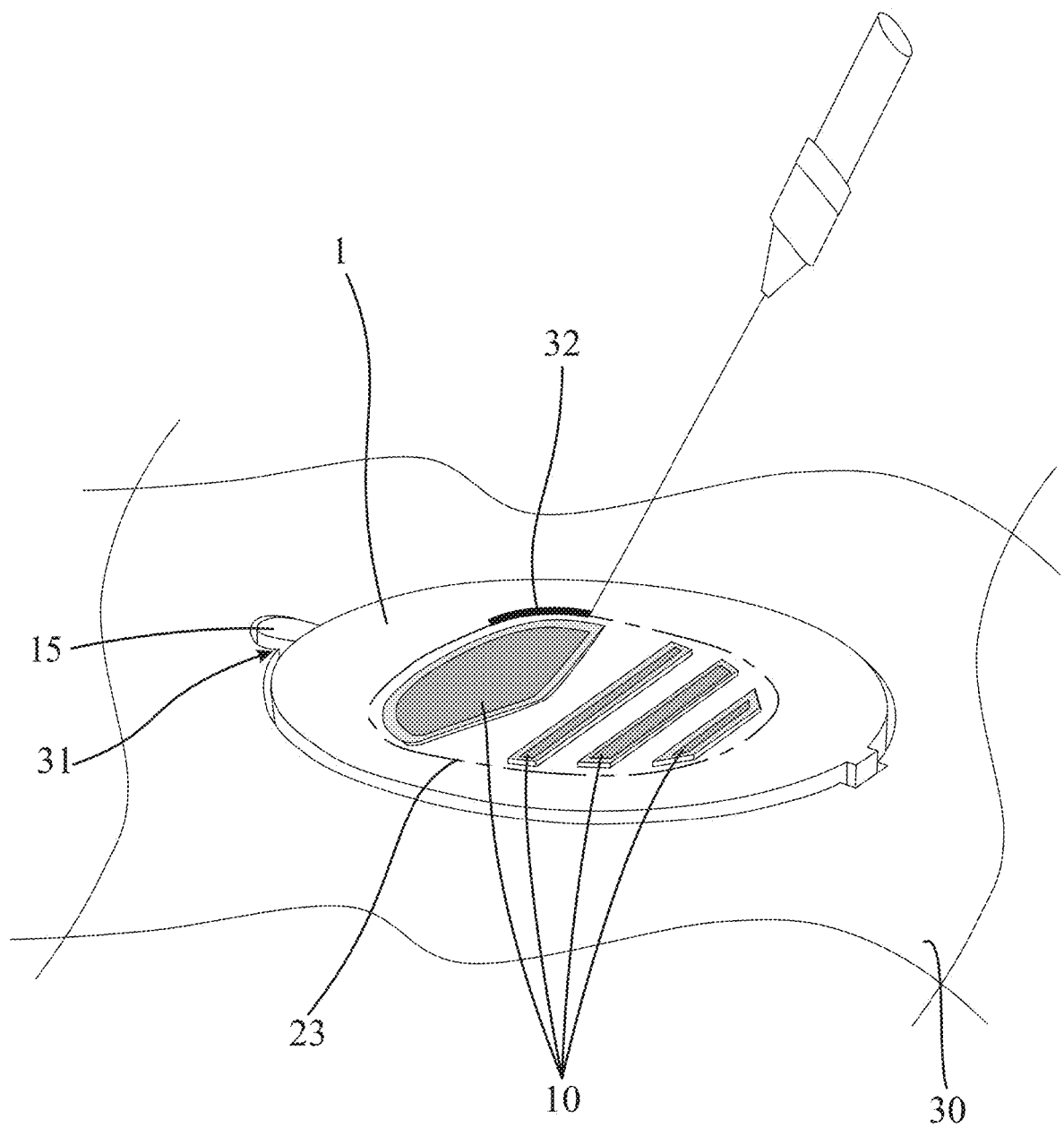
FIG. 21 shows a schematic view of a cutting step provided in the method, object of the present invention.

In particular, the cutting step is preferably executed by means of cutting means, for example comprising a laser beam, which are advantageously automatically driven by control means susceptible of guiding them in order to cut the lens blank 1 along the cutting profile 23; see for example the enclosed FIG. 21, in which the aforesaid cutting step is schematically represented and in which the laser beam is adapted to define a cutting line 32 on the lens blank 1 that is arranged along the preset cutting profile 23.

In particular and in accordance with the enclosed FIG. 21, before the aforesaid cutting step the lens blank 1 is advantageously associated with a second template 30, provided with a fifth centering reference 31, with respect to which the first centering reference 15 is newly oriented.

Advantageously, then, by knowing the position of the fifth centering reference 31 it is also possible to know the position of the exposed profile 20 of the coating layer 10 and thus it is possible to program the aforesaid control means for automatically cutting the lens blank 1 in relation to the position of the obtained coating layer 10.

Advantageously, moreover, the present method allows automating the step of cutting the lens blanks 1, thus speeding up the production process of the mirrored eyeglass lenses with the present method.

Advantageously, the present method allows attaining innumerable aesthetic effects on the lens blank 1. For example, it allows varying the shape and size of the coating layer 10 by varying the shape and size of the first shaped and through openings 4. Or, it allows varying the coloring type of the coating layer 10 by varying the material to be deposited on the lens blank 1. In addition, the present method allows attaining, on a same lens blank 1, multiple different coating layers 10 by varying the number of coating steps.

Hereinbelow, several embodiments of the present method will be described, each of which advantageously aimed to obtain a different aesthetic effect.

As indicated above, the present method can provide for hitting the lens blank 1 with coating layers 10 of different coloring by varying the material to be deposited in the coating step.

In particular, in accordance with a first embodiment, the coating layer 10 deposited in the coating step is constituted by one or more metal materials, mixed together in a uniform compound, which are susceptible of conferring to the coating layer 10 the mirrored coloring typical of the specific metal material.

Otherwise, in accordance with a second embodiment, the coating layer 10 is constituted by multiple separate substrates of different materials and preferably by two or more separate substrates of two materials alternated with each other.

In particular, in the aforesaid second embodiment, the materials which constitute the various substrates are preferably inorganic salts or oxides (in particular of the above-listed type), which are susceptible of reflecting and refracting the light and, superimposed on each other, are susceptible of producing phenomena of optical interference such to allow perceiving a mirrored coloring of the coating layer 10, which depends on the type of material with which each substrate is attained, on the number of such superimposed substrates and on their thickness.

Indeed, in operation, the light that hits the various substrates is susceptible of being divided into a reflected component and a refracted component, the latter is propagated into the substrate itself up to intercepting the subsequent substrate, at which it is newly divided into a reflected component and a refracted component. The various components of light reflected and refracted by the various superimposed substrates are then susceptible of being added to each other according to the laws of optics and produce phenomena of optical interference that determine the formation of a light radiation reflected by the coating layer 10, which is advantageously centered only over several wavelengths of the visible spectrum and thus confers a specific mirrored coloring to the coating layer 10.

In particular, in the aforesaid second embodiment, it is possible to size each substrate of the coating layer 10 so as to obtain the desired final coloring.

In operation, the aforesaid second embodiment provides for arranging the plurality of materials to be deposited within the mirroring chamber 101, in corresponding crucibles 102 and then provides for heating each crucible 102 at different time intervals, so as to produce different flows of particles in vapor phase at different times.

In this manner, each substrate of the coating layer 10 is advantageously composed of only one material and does not contain impurities of other materials.

Of course, it is also possible to simultaneously heat multiple crucibles 102 containing different materials to be deposited. In this manner, the coating layer 10 deposited on the lens blank 1 is constituted by a substantially uniform compound of the different heated materials.

As indicated above, the present method can also provide for a different number of coating steps, and in particular it can provide for two or more coating steps in which the lens blank 1 is coated with different coating layers 10.

In particular, if the support body 2 is provided with two or more second centering references 25, the present method can comprise two or more coating steps spaced from each other by corresponding assembly steps in which the lens blank 1 is extracted from the first abutment seat 3 and repositioned in the same in an angled position, with the first centering reference 15 oriented with respect to a different second centering reference 25.

In particular, the first centering reference 15 attained in the form of a projecting tooth is advantageously engaged in a different second centering reference 25 attained in the form of a female seat in order to vary the orientation of the first centering reference 15 with respect to the second centering reference 25.

In particular, in each aforesaid assembly step, the lens blank 1 is oriented with respect to a different second centering reference 25 in a known manner, according to angles predefined in design step so as to make, on the lens blank 1, multiple coating layers 10 that are at least partially superimposed and angled with respect to each other, for example in order to recreate an aesthetic effect in which the different coating layers 10 design the weave of a fabric.

In addition, if the centering template 5 is provided with two or more fourth centering references 26, the present method can comprise two or more coating steps spaced from each other by corresponding assembly steps in which the support body 2 is extracted from the second abutment seat 6 and repositioned in the same in a further angled position, with the third centering reference 16 oriented with respect to a different fourth centering reference 26.

In particular, the third centering reference 16 attained in the form of a projecting ear is advantageously engaged in a different fourth centering reference 26 attained in the form of a female seat in order to vary the orientation of the third centering reference 16 with respect to the fourth centering reference 26.

In particular, in each aforesaid assembly step, the support body 2 is oriented with respect to a different fourth centering reference 26 in a known manner, according to angles predefined in design step.

Advantageously, moreover, the present method can comprise two or more coating steps spaced from each other by corresponding assembly steps in which the lens blank 1 is extracted from the first abutment seat 3 of the support body 2 and is inserted in a different first abutment seat 3 of a different support body 2 having at least one different first shaped and through opening 4.

More in detail, the expression "different first shaped and through opening 4" means that the different support body 2, provided in a subsequent assembly step, is equipped with a first shaped and through opening 4 which develops along a shaped profile 24 different from that along which the first shaped and through opening 4 of the support body 2 provided in the previous assembly step develops. In a different embodiment, the aforementioned different first shaped and through opening 4 is advantageously delimited by perimeter walls 4' having a predefined height or a tilt which differs from the perimeter walls 4' of the first shaped and through opening 4 of the support body 2 provided in the previous assembly phase.

Advantageously, moreover, each coating layer 10 obtained in the aforesaid two or more coating steps can be provided with a different coloring in order to create further aesthetic effects.

In accordance with the enclosed FIGS. 8, 13, 16, 17, 18 and 20, moreover, each coating step advantageously produces a faded perimeter edge 11 of the coating layer 10 due to partial interference of the support body 2 with the flow of particles in vapor phase intended to be deposited on the lens blank 1.

More in detail, the flow of particles in vapor phase advantageously comprises a plurality of particles 103 suspended at its interior, each of which advancing towards the lens blank 1 with its own trajectory, arranged at least partially randomly within the flow of particles in vapor phase.

Consequently, the particles 103 that are moved along trajectories substantially parallel to the perimeter walls 4' of the first shaped and through opening 4 are susceptible of entirely crossing such first shaped and through opening 4 and of being deposited on the internal face of the lens blank 1. Otherwise, the particles 103 which are moved along tilted trajectories with respect to the perimeter walls 4' can be intercepted by the support body 2 (or by the centering template 5) and do not impact against the lens blank 1.

In particular, as schematized in the enclosed FIGS. 7A-C, the lower face 19 of the support body 2 is susceptible of intercepting at least one fraction of the particles 103 that advance along tilted trajectories towards the lens blank 1 and in particular the fraction of particles 103 directed towards the perimeter walls 4' of the first shaped and through opening 4. Consequently, the coating layer 10 which is deposited at such perimeter walls 4' is susceptible of being provided with a smaller thickness with respect to a central zone of the coating layer 10 itself, which substantially is not affected by the presence of the perimeter walls 4', and thus determines the aforesaid faded perimeter edge 11.

In particular, as schematically indicated in FIG. 10, the coating layer 10 at the faded perimeter edge 11 is provided with a thickness which diminishes from the thickness present in the central zone up to a minimum thickness at the exposed profile 20. In particular, in FIG. 10, the coating layer 10 at the faded perimeter edge 11 is indicated as diminishing with a substantially step-like progression: however, it is intended that such representation is only schematic and non-limiting, and in particular the coating layer 10, at its faded perimeter edge 11, advantageously diminishes with a ramp progression, in which steps are not recognizable.

Advantageously, the aforesaid faded perimeter edge 11 is provided with a faded coloring that diminishes from the central zone of the coating layer 10, where its thickness is maximal, towards its external perimeter, where its thickness is minimal, thus as schematically indicated in FIGS. 9 and 10. Indeed, as indicated above, the coloring of the coating layer 10 depends on its thickness, and by the thickness of the various substrates that constitute it.

Advantageously, moreover, the faded perimeter edge 11 is extended from the exposed profile 20 of the coating layer 10 for a width proportional to the predefined height of the perimeter walls 4' of the first shaped and through opening 4. Indeed, given the same tilt angle of the trajectory of the particles 103, perimeter walls 4' that are lifted for predefined greater heights are susceptible of intercepting particles 103 directed towards an annular band of the lens blank 1 of greater width.

In particular, represented in the enclosed FIGS. 7A, 7B and 7C are three different support bodies 2, provided with through openings 4 delimited by perimeter walls 4' which are extended for predefined different heights. From the comparison of such figures, it is possible to observe that, for a same angle of incidence a of the particles 103 against the internal surface of the lens blank 1, the perimeter walls 4' of predefined greater height project a shadow on the lens blank 1, substantially coinciding with the faded perimeter edge 11, of greater width.

In particular, in the embodiment in which the perimeter walls 4' are arranged parallel to the longitudinal axis Y of the support body 2, it is possible to compare the width of such shadow to the extension of one of the catheti O of a right triangle, inscribed between the perimeter wall 4' itself and the tilted trajectory of a particle 103. Advantageously, therefore, it is possible to calculate the width of such cathetus O by means of the ratio between the predefined height of the perimeter wall 4' and the tangent of the incidence angle α:

$$O = 4'/\tan \alpha.$$

In other words, for constant α, with the increase of the predefined height of the perimeter walls 4', the width of the shadow projected by the wall 4' itself also increases, and consequently the width of the faded perimeter edge 11 of the coating layer 10 increases.

Advantageously, the perimeter walls 4' of the first shaped and through opening 4 are therefore calibrated with a predefined height such to obtain the faded perimeter edge 11 of desired width.

Advantageously, moreover, as indicated above with reference to the second embodiment of FIG. 15, the perimeter walls 4' of the first shaped and through opening 4 can be equipped with predefined tilt with respect to the longitudinal axis Y. In particular, the perimeter walls 4' can be arranged tilted with respect to the longitudinal axis Y and in particular they can be arranged tilted by a predefined angle such to reduce or cancel the width of the faded perimeter edge 11. Indeed, in operation, the perimeter walls 4' which are tilted away from the center of the first shaped and through opening 4 are susceptible of intercepting a reduced fraction of the flow of particles in vapor phase and hence they are susceptible of projecting a shadow of smaller extension.

Otherwise, perimeter walls 4' which are tilted towards the center of the first shaped and through opening 4 are susceptible of intercepting a greater fraction of the flow of particles in the vapor phase and hence they are susceptible of projecting a shadow of greater extension.

Advantageously, the present method then provides for calibrating the height and/or the predefined tilt of the perimeter walls 4' based on the width of the faded perimeter edge 11 that one wishes to obtain.

Advantageously, without thereby departing from the scope of protection of the present patent, the present method can provide for calibrating the height and/or the predefined tilt of the perimeter walls 4' so as to obtain a coating layer substantially free of the faded perimeter edge 11.

In particular, the coating layer 10 produced with the present method, i.e. centered with respect to the cutting edge 20 and provided with the faded perimeter edge 11, confers to the final lens L an external/aesthetic effect that is particularly appreciable and not attainable with the coating methods known up to now.

Advantageously, therefore, the cutting step provides for cutting the lens blank 1 along the cutting profile 23, which for at least one section is arranged at the faded perimeter edge 11 so as to thus obtain a final lens L in which the coating layer 10 diminishes with the perimeter edge 11 faded towards the perimeter of the lens itself.

The present method is thus advantageously adapted to exploit the faded perimeter edge 11 suitably calibrated as an aesthetic motif, which cannot be attained with the presently known coating methods.

Figure 13:
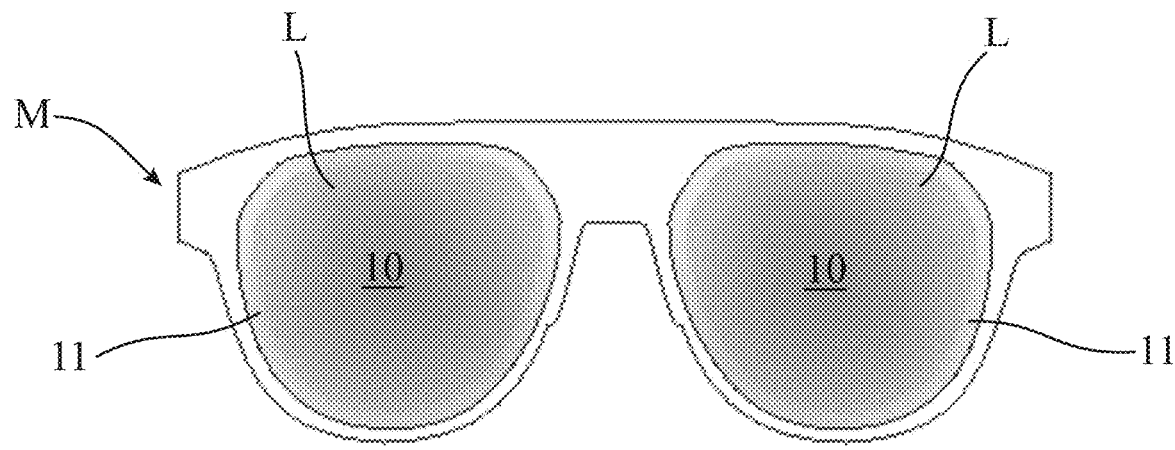
FIG. 13 shows a pair of eyeglasses provided with a pair of lenses coated with the method, object of the present invention.

For example, in accordance with the enclosed FIG. 13, it is possible to create a final lens L entirely covered by the coating layer 10, which is provided with the faded perimeter edge 11 arranged at the external perimeter of the final lens L itself. Or, in accordance with the enclosed FIGS. 17 and 20, it is possible to create a final lens L only partially covered with the coating layer 10, which can be shaped in innumerable forms and sizes and is positioned within the final lens L in a manner such to create the desired aesthetic effect.

Also forming the object of the present invention is a support body for a lens blank intended to be employed in a method for making a mirrored eyeglass lens coated by means of physical vapor deposition PVD, and in particular intended to be used in the method, object of the present invention, described above, and regarding which the same reference nomenclature will be employed for the sake of description simplicity.

In particular, the support body 2, object of the present invention, is advantageously intended to be housed in a second abutment seat 6 of a centering template 5 that is per se known to the man skilled in the art and generally employed in PVD apparatuses 100, also per se known to the man skilled in the art.

Advantageously, the support body 2 is provided with an external profile shaped like a lens blank 1, i.e. substantially circular, and preferably is provided with dimensions substantially corresponding to those of the lens blanks 1 themselves. In this manner, the support body 2 is configured for being housed in the second abutment seat 6, in particular housed to size in the aforesaid second abutment seat 6.

More in detail, in accordance with the enclosed figures, the support body 2 preferably has substantially cylindrical form (being intended that it preferably has an axial extension like the projection of a figure along an axis) and is extended along a longitudinal axis Y between an upper face 18 and an opposite lower face 19, intended to abut against a second bottom wall of the second abutment seat 6 of the centering template 5.

According to the idea underlying the present invention, the support body 2 comprises a first abutment seat 3 susceptible of receiving in abutment the lens blank 1 to be coated. In particular, the first abutment seat 3 is advantageously obtained starting from the upper face 18 of the support body 2 and is preferably delimited by a bottom wall 12 and by an annular shoulder 13 that is counter-shaped with respect to the lens blank 1.

Preferably, moreover, so as to better house the lens blank 1 within the first abutment seat 3, the bottom surface 12 of the first abutment seat 3 is provided with a concavity substantially counter-shaped with respect to the convexity of the lens blank 1, as can be appreciated in the enclosed FIGS. 6, 7A-C and 15.

According to the idea underlying the present invention, the support body 2 also comprises at least one second centering reference 25, with respect to which a first centering reference 15 of the lens blank 1, intended to be housed in the first abutment seat 3, is susceptible of being oriented (i.e. placed in a relative known position).

In accordance with a preferred embodiment illustrated in the enclosed figures, the second centering reference 25 is preferably made in the form of a female seat, sunken starting from the first abutment seat 3 and, in particular, starting from its annular shoulder 13. Advantageously, additionally, the aforesaid female seat is counter-shaped with respect to the first centering reference 15, made in the form of a tooth projecting from the lens blank 1, and is susceptible of being engaged with the latter via shape coupling.

In accordance with a further embodiment, the first and the second centering references 15, 25 can be made in forms different from a projecting tooth and a female seat, for example they can be made in notch form or they can be defined by counter-shaped forms of the first abutment seat 3 and the lens blank 1.

Advantageously, the support body 2 comprises two or more centering references 25, preferably of the type attained in female seat form, and in particular comprises a number at least equal to and preferably greater than the number of first centering references 15 of the lens blank 1. Advantageously, in this manner, the support body 2 is adapted to house, in its first abutment seat 3, the lens blank 1 in multiple positions that are predefined and oriented with respect to the second centering references 25.

In addition, according to the idea underlying the present invention, the support body 2 comprises at least one first shaped and through opening 4, oriented with respect to the second centering reference 25. In particular, the first shaped and through opening 4 is intended to be crossed by a flow of particles in vapor phase in order to deposit on the lens blank 1, housed in the first abutment seat 3, a coating layer 10, which is provided with an exposed profile 20 with shape substantially coinciding with the shape of the first shaped and through opening 4.

In particular, in accordance with the embodiment illustrated in the enclosed FIGS. 14 and 15, the support body 2 is provided with two or more first shaped and through openings 4, which are shaped in pre-established shapes so as to obtain coating layers 10 provided with the desired exposed profiles 20.

More in detail, each first shaped and through opening 4 is advantageously delimited by at least one perimeter wall 4', which is extended starting from the first abutment seat 3 for a predefined height and is arranged along a shaped profile 24, whose position is known with respect to the second centering reference 25.

In particular, the shaped profile 24, along which the perimeter walls 4' of the aforesaid first shaped and through opening 4 are arranged, is suitably shaped in the desired shape and size. For example, the shaped profile 24 can be shaped in eyeglass lens form and in particular in the shape of a specific final lens L intended to be mounted on a specific eyeglass frame M. Such shape can then vary based on the model of eyeglasses that one wishes to attain. For example, the shaped profile 24 can be shaped in drop form or have substantially circular shape, rectangular shape, trapezoidal shape or have yet another shape without departing from the protective scope of the present patent.

Otherwise, the shaped profile 24 can be shaped in forms different from the form of the final lens L intended to be made by the lens blank 1, e.g. it can be shaped in lens sector form, or in strip form (as indicated in the enclosed FIG. 14) or in geometric form (as indicated in the enclosed FIG. 18) or in still other shapes without departing from the scope of the present patent.

Advantageously, the perimeter walls 4' are extended between the first bottom wall 12 of the first abutment seat 3 and the lower face 19 of the support body 2 and are extended substantially parallel to the longitudinal axis Y of the support body 2 itself for a predefined height substantially coinciding with the difference between the height of the support body 2, between its upper and lower faces 18, 19, and the depth of the first abutment seat 3, between the upper face 18 and the first bottom wall 12. In particular, the perimeter walls 4' are extended for a predefined height comprised between 0.1 and 5 cm and preferably comprised between 0.5 and 3 cm.

Otherwise, in accordance with the enclosed FIG. 15, the perimeter walls 4' of the first through openings 4 can be extended starting from the bottom wall 12 of the first abutment seat 3 for a reduced height with respect to the predefined height between the first bottom wall 12 of the first abutment seat 3 and the lower face 19 of the support body 2. In addition, such perimeter walls 4' can be advantageously arranged in a tilted manner with respect to the longitudinal axis Y of the support body 2 in order to delimit tapered first through openings 4.

As indicated above, the first shaped and through opening 4 is intended to be crossed by a flow of particles in vapor phase in order to deposit the coating layer 10 on the lens blank 1.

In particular, the flow of particles in vapor phase is of the type attained by means of a PVD apparatus 100, e.g. via thermal evaporation of one or more materials to be deposited, such as metal materials, inorganic oxides or inorganic salts.

In addition, the flow of particles in vapor phase which crosses the first shaped and through opening 4 is susceptible of depositing the coating layer 10 provided with the exposed profile 20 with shape substantially coinciding with the shaped profile 24 of the first shaped and through opening 4.

Advantageously, the aforesaid coating layer 10, starting from its exposed profile 20, is provided with a faded perimeter edge 11 of limited thickness, which is due to a partial interference of the support body 2 itself with the flow of particles in vapor phase.

Advantageously, moreover, each first shaped and through opening 4 is provided with a predefined height that is calibrated in order to obtain a desired width of the faded perimeter edge 11 of the coating layer 10, and such height is proportional to said predefined height, in accordance with that indicated above with reference to the method, object of the present invention.

Figure 12:
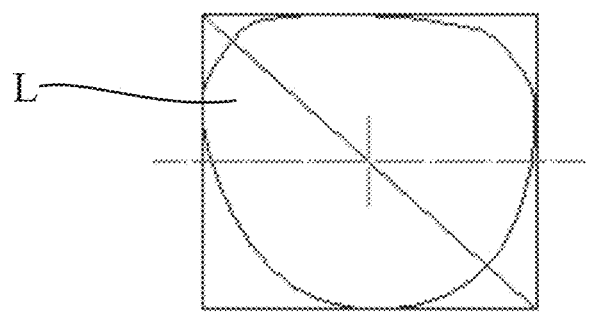

Advantageously, the present support body 2 is suitably designed starting from the shape of the final lenses L that one wishes to obtain. More in detail, in accordance with the enclosed FIGS. 11 and 12, the design of the support body 2 preferably starts from the determination of the geometric center of each of the two final lenses L (right and left) to be associated with a desired eyeglass frame M. In particular, the determination of the geometric center advantageously occurs by framing the shape of the final lens L in a rectangle and tracing the directrix lines, such as the diagonals or the medians or a diagonal and a median, as indicated in the example of FIG. 12.

Subsequently, the design of the support body 2 preferably provides for sizing the first housing seat 3 in a manner such that the latter retains via shape coupling the lens blank 1 that one intends to house therein.

In particular, the second centering references 25 are sized based on the first centering references 15 of the lens blank 1 intended to be housed in the first abutment seat 3.

Advantageously, moreover, the first abutment seat 3 is positioned within the support body 2 in a manner such that the geometric center of the final lens L to be obtained coincides with the geometric center of the first abutment seat 3.

Once the first housing seat 3 is sized, the first shaped and through opening 4 is then advantageously sized, which is suitably shaped along the shaped profile 24 substantially coinciding with the exposed profile 20 that one wishes to give to the coating layer 10.

In addition, the first shaped and through opening 4 is advantageously positioned within the first housing seat 3 in a manner such that the coating layer 10 is positioned, within the final lens L that one wishes to obtain, at a pre-established position, based on the desired aesthetic effect.

Finally, the design of the support body 2 advantageously provides for determining a function indicative of the position of the perimeter walls 4' of the first shaped and through opening 4 with respect to the second centering reference 25. Consequently, once the position of the perimeter walls 4' is determined with respect to the second centering reference 25, also the position of the same perimeter walls 4' is determined with respect to the first centering reference 15. Advantageously, starting from such function, it is thus possible to know the position of the exposed profile 20 of the coating layer 10 deposited on the lens blank 1 with respect to the first centering reference 15.

Advantageously, moreover, the step of designing the support body 2 also provides for sizing its external profile in a manner such to allow inserting the support body 2 itself to size within the second abutment seat 6 of the centering template 5.

In particular, the support body 2 advantageously comprises at least one third centering reference 16, with respect to which the support body 2 is susceptible of being oriented in the centering template 5.

For example, the third centering reference 16 is advantageously attained in the form of a projecting ear 16, which is projectingly extended from an external wall of the support body 2 and is susceptible of being housed in a fourth centering reference 26 of the centering template 5, advantageously made in the form of a female seat.

More in detail, the female seat of the fourth centering reference 26 is advantageously obtained starting from the second abutment seat 6 of the centering template 5, which, in the mirroring methods of known type, is generally aimed to house the projecting tooth of the lens blank 1.

Preferably, moreover, the support body 2 is provided with a step 21 that is sunken starting from its peripheral profile at its lower face 19.

In particular, the aforesaid step 21 is intended to abut against a corresponding perimeter wall of a second through opening 7 of the centering template 5 obtained starting from the second abutment seat 6, so as to ensure a more stable positioning of the support body 2 in the second abutment seat 6.

The method and the support body 2 thus conceived therefore attain the pre-established objects that is, they allow to make an eyeglass lens and an eyewear provided with lenses coated with a coating layer suitably oriented to achieve a desired aesthetic effect.

The invention claimed is:

1. A method for making an eyeglass lens coated by means of physical vapor deposition PVD, said method comprising:
  a step of arranging a lens blank provided with at least one first centering reference;
  a step of arranging a support body provided with a first abutment seat adapted to house said lens blank, with at least one second centering reference and with at least one first shaped and through opening, which is oriented with respect to said second centering reference;
  a step of arranging a centering template provided with a second abutment seat adapted to house said support body and with at least one second through opening;
  an assembly step, in which:
    said lens blank is housed in the first abutment seat of said support body, to close said at least one first shaped and through opening, orienting said first centering reference with respect to said second centering reference, and said support body is housed in the second abutment seat of said centering template with said first shaped and through opening and said second through opening substantially aligned with each other;

at least one step of coating said lens blank by means of physical vapor deposition PVD, in which a flow of particles in vapor phase is directed towards said lens blank, through said second and first shaped and through openings and is deposited on said lens blank, forming at least one coating layer thereon that is provided with an exposed profile with shape substantially coinciding with the first shaped and through opening of said support body;

a cutting step in which said lens blank is cut along a cutting profile which is shaped in the form of eyeglass lens and is oriented with respect to said first centering reference.

2. The method of claim 1, wherein said first centering reference is attained in the form of a tooth projecting from said lens blank and said second centering reference is made in the form of a sunken female seat in said support body, counter-shaped with respect to said first centering reference and adapted to be engaged via shape coupling with said first centering reference in said assembly step.

3. The method of claim 1, wherein the first shaped and through opening of said support body is shaped in the form of an eyeglass lens.

4. The method of claim 1, wherein said cutting profile coincides with the exposed profile of said coating layer.

5. The method of claim 1, wherein said support body is provided with a third centering reference and said centering template is provided with a fourth centering reference;

said assembly step providing for housing said support body in the second abutment seat of said centering template, orienting said third centering reference with respect to said fourth centering reference.

6. The method of claim 5, wherein said centering template comprises two or more said fourth centering references;

said method comprising two or more coating steps, spaced from each other by corresponding assembly steps, in which said support body is extracted from said second abutment seat and repositioned in the same in an angled position, with said third centering reference oriented with respect to a different fourth centering reference of said centering template.

7. The method of claim 1, wherein said support body comprises two or more said second centering references;

said method comprising two or more coating steps, spaced from each other by corresponding assembly steps, in which said lens blank is extracted from the first abutment seat of said support body and repositioned in the same in an angled position, with said first centering reference oriented with respect to a different second centering reference of said support body.

8. The method of claim 1, further comprising two or more coating steps, spaced from each other by corresponding assembly steps in which said lens blank is extracted from the first abutment seat of said support body and is inserted in a different first abutment seat of a different support body having at least one different said first shaped and through opening.

9. The method of claim 1, wherein said support body is provided with a plurality of said first shaped and through openings and said coating layer comprising a plurality of said exposed profiles with shape substantially coinciding with said plurality of first shaped and through openings.

10. The method of claim 1, wherein said coating step produces a faded perimeter edge of said coating layer due to partial interference of said support body with said flow of particles in vapor phase;

said cutting step providing for cutting said lens blank along said cutting profile, which for at least one section is at said faded perimeter edge.

* * * * *